United States Patent
Utsunomiya et al.

(10) Patent No.: US 9,100,263 B2
(45) Date of Patent: Aug. 4, 2015

(54) DISTORTION COMPENSATION APPARATUS AND DISTORTION COMPENSATION METHOD

(75) Inventors: Yuichi Utsunomiya, Yokosuka (JP); Hiroyoshi Ishikawa, Yokohama (JP); Nobukazu Fudaba, Yokohama (JP); Kazuo Nagatani, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 257 days.

(21) Appl. No.: 13/420,760

(22) Filed: Mar. 15, 2012

(65) Prior Publication Data

US 2012/0275545 A1 Nov. 1, 2012

(30) Foreign Application Priority Data

Apr. 28, 2011 (JP) ................. 2011-102451

(51) Int. Cl.
*H03F 1/32* (2006.01)
*H04L 27/36* (2006.01)

(52) U.S. Cl.
CPC ............ *H04L 27/368* (2013.01); *H03F 1/3247* (2013.01); *H03F 2201/3233* (2013.01)

(58) Field of Classification Search
CPC ................... H03F 2201/3233; H03F 1/3241
USPC ................................. 375/295–297
See application file for complete search history.

(56) References Cited

U.S. PATENT DOCUMENTS

| 7,414,470 | B2 | 8/2008 | Okazaki | |
|---|---|---|---|---|
| 7,466,762 | B2 | 12/2008 | Shako et al. | |
| 7,561,636 | B2 | 7/2009 | Song et al. | |
| 7,778,612 | B2 | 8/2010 | Shimizu et al. | |
| 2003/0146787 | A1* | 8/2003 | Hedberg et al. | 330/149 |
| 2006/0023807 | A1 | 2/2006 | Shako et al. | |
| 2006/0159198 | A1 | 7/2006 | Morimoto et al. | |
| 2007/0008033 | A1* | 1/2007 | Okazaki | 330/149 |
| 2009/0023402 | A1 | 1/2009 | Shimizu et al. | |

FOREIGN PATENT DOCUMENTS

| JP | 2006-50073 | 2/2006 |
|---|---|---|
| JP | 2006-333445 | 12/2006 |
| JP | 2007-19782 | 1/2007 |
| WO | 2005/104352 | 11/2005 |

* cited by examiner

*Primary Examiner* — Kevin M Burd
(74) *Attorney, Agent, or Firm* — Katten Muchin Rosenman LLP

(57) ABSTRACT

A distortion compensation apparatus for performing distortion compensation processing by applying the inverse properties of distortion properties of the power amplifier to a transmission signal to be input to a power amplifier, includes a plurality of distortion compensation coefficient storage units configured to store a plurality of distortion compensation coefficients used for the distortion compensation processing, an offset correction processing unit configured to subject the distortion compensation coefficient stored in each of the plurality of distortion compensation coefficient storage units to offset correction processing, and to generate distortion compensation coefficients in the case that the offset correction processing has not been performed, corresponding to plurality of distortion compensation coefficient storage units, in a pseudo manner and a distortion compensation processing unit configured to subject the transmission signal to the distortion compensation processing based on the distortion compensation coefficients generated in a pseudo manner.

13 Claims, 16 Drawing Sheets

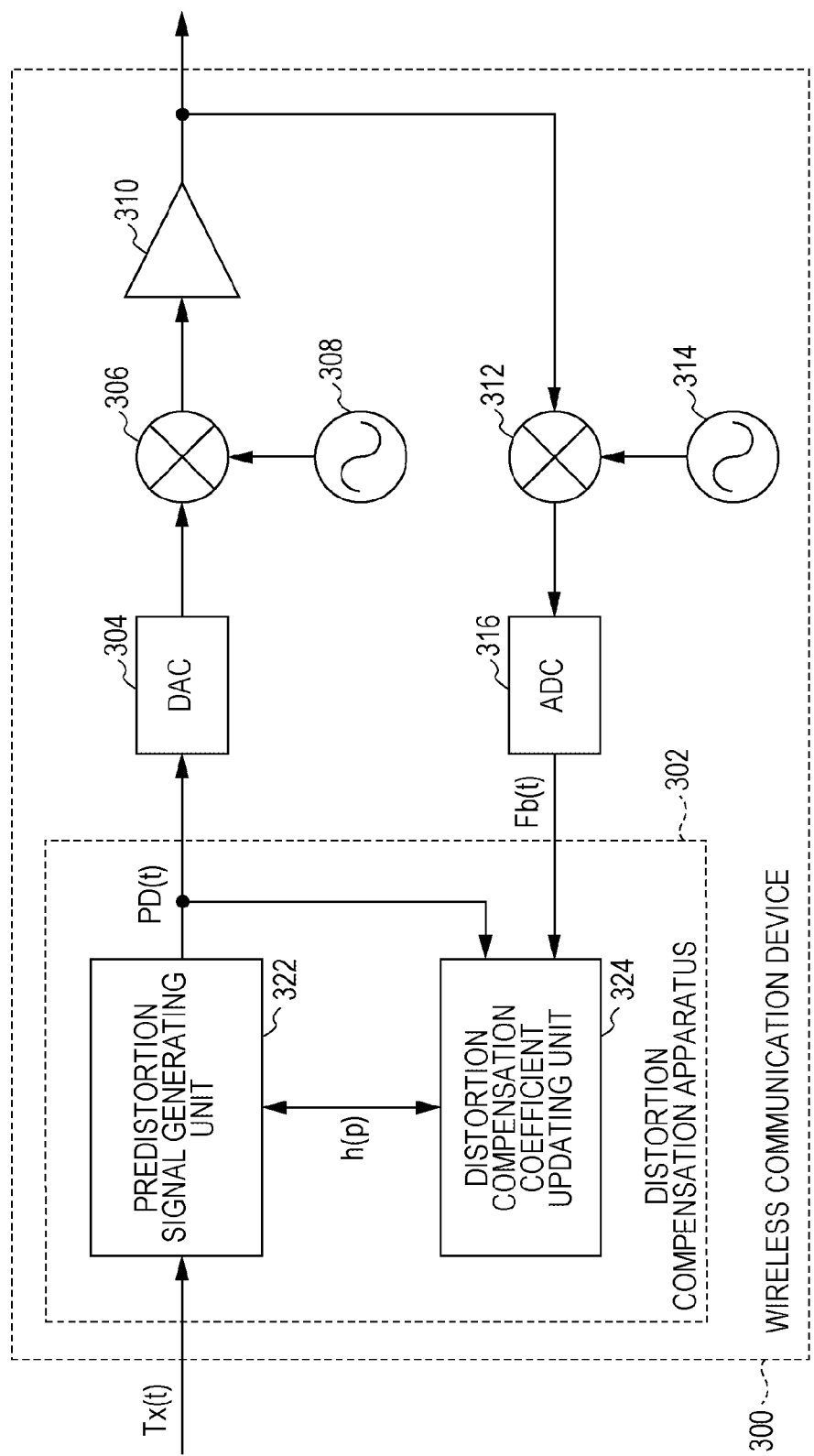

DISTORTION COMPENSATION APPARATUS AND DISTORTION COMPENSATION METHOD

CROSS-REFERENCE TO RELATED APPLICATION(S)

This application is based upon and claims the benefit of priority of the prior Japanese Patent Application No. 2011-102451, filed on Apr. 28, 2011, the entire contents of which are incorporated herein by reference.

FIELD

A technique disclosed in one aspect of embodiments of the present disclosure relates to a distortion compensation apparatus and a distortion compensation method.

BACKGROUND

With wireless communication devices in wireless communication systems, high efficiency has strongly been demanded from a viewpoint such as reduction in device size, and energy saving.

Power amplifiers in wireless communication devices are generally used at a high-efficiency saturation region. However, it has been recognized that in the event that a power amplifier is used around a saturation region, nonlinear distortion increases. As for a technique for reducing adjacent channel leakage power (Adjacent Channel Power, ACP) while suppressing this nonlinear distortion, there is distortion compensation processing. A distortion compensation apparatus configured to perform distortion compensation processing is included in wireless communication devices. As for distortion compensation apparatuses, there is a device employing a method such as series type or look up table (hereafter, referred to be as LUT) type, or the like.

On the other hand, with power amplifiers, it has been recognized that a phenomenon such as memory effect occurs. The memory effect is a phenomenon wherein, with a power amplifier, an output signal as to an input signal at certain point-in-time is influenced by an input signal in the past. Accordingly, a power amplifier has been desired wherein nonlinear distortion in the above power amplifier can be compensated, and also influence of memory effect in a power amplifier can be compensated.

Note that U.S. Pat. No. 7,561,636 has disclosed an example of a distortion compensation apparatus including multiple LUT. Also, Japanese Laid-open Patent Publication No. 2007-019782 has disclosed a technique for obtaining the offset of a distortion compensation coefficient stored in a LUT, and performing distortion compensation processing using a distortion compensation coefficient obtained by subtracting this offset.

SUMMARY

According to an aspect of the invention, a distortion compensation apparatus for performing distortion compensation processing by applying the inverse properties of distortion properties of said power amplifier to a transmission signal to be input to a power amplifier, includes a plurality of distortion compensation coefficient storage units configured to store a plurality of distortion compensation coefficients used for said distortion compensation processing, an offset correction processing unit configured to subject said distortion compensation coefficient stored in each of said plurality of distortion compensation coefficient storage units to offset correction processing, and to generate distortion compensation coefficients in the case that said offset correction processing has not been performed, corresponding to said plurality of distortion compensation coefficient storage units, in a pseudo manner and a distortion compensation processing unit configured to subject said transmission signal to said distortion compensation processing based on said distortion compensation coefficients generated in a pseudo manner.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating an example of the configuration of a wireless communication device including a multi-LUT-type distortion compensation apparatus according to a first embodiment;

DESCRIPTION OF EMBODIMENTS

Hereafter, embodiments of the present disclosure will be described.

EMBODIMENTS

As for a distortion compensation apparatus capable of compensating distortion due to memory effect in addition to nonlinear distortion at a power amplifier while suppressing increase in circuit scale, there is a multi-LUT-type distortion compensation apparatus. The multi-LUT-type distortion compensation apparatus includes multiple LUT, and generates a pre-distortion signal by performing distortion compensation processing based on multiple distortion coefficients stored in the multiple LUT and a transmission signal.

Figure 1:
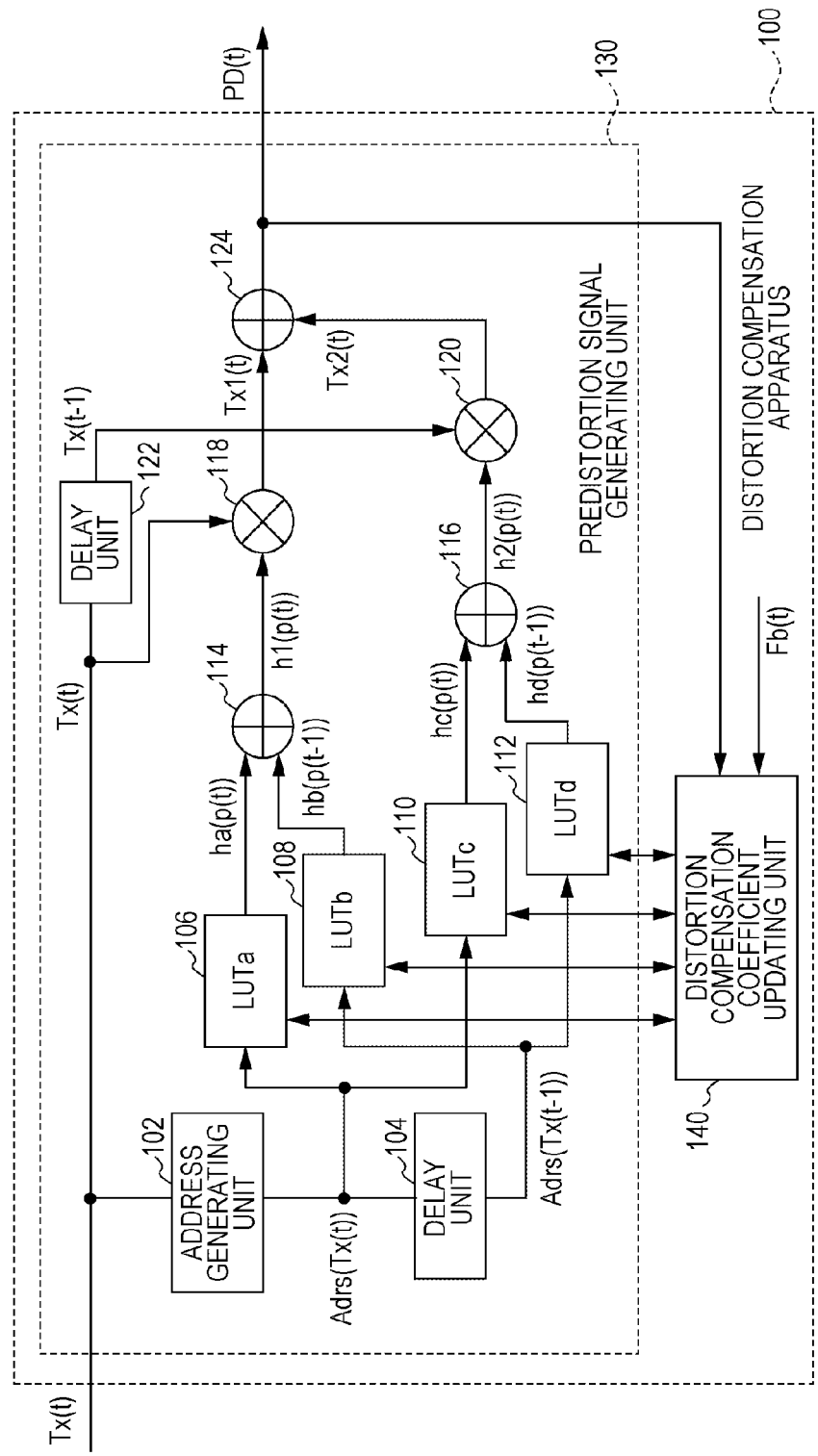
FIG. 1 is a diagram illustrating an example of the internal configuration of a multi-LUT-type distortion compensation apparatus.

FIG. 1 is a diagram illustrating an example of the internal configuration of a multi-LUT-type distortion compensation apparatus 100. As illustrated in FIG. 1, a pre-distortion signal generating unit 130 of the distortion compensation apparatus 100 includes an address generating unit 102, a delay unit 104, a LUTa (Look Up Table) 106, a LUTb 108, a LUTc 110, a LUTd 112, adders 114 and 116, multipliers 118 and 120, a delay unit 122, and an adder 124.

The address generating unit 102 receives a transmission signal Tx(t), and generates an address Adrs(Tx(t)) corresponding to the power value p(t) of the transmission signal Tx(t). The generated address Adrs(Tx(t)) is supplied to the LUTa 106 and LUTc 110.

The delay unit 104 receives the address Adrs(Tx(t)) generated by the address generating unit 102. The delay unit 104 outputs the received address Adrs(Tx(t)) by delaying output by time equivalent to difference between the current reference point-in-time and the previous reference point-in-time, thereby generating an address Adrs(Tx(t−1)) corresponding to the power value p(t−1) of the transmission signal Tx(t−1) at the previous reference point-in-time t−1. The generated address Adrs(Tx(t−1)) is supplied to the LUTb 108 and LUTd 112.

The LUTa 106 received the address Adrs(Tx(t)), and reads out a distortion compensation coefficient ha(p(t)) from the location indicated by the received address Adrs(Tx(t)). The LUTa 106 supplies the read distortion compensation coefficient ha(p(t)) to the adder 114. In the same way, the LUTc 110 receives the address Adrs(Tx(t)) to supply a distortion compensation coefficient hc(p(t)) to the adder 116.

The LUTb 108 receives the address Adrs(Tx(t−1)), and reads out a distortion compensation coefficient hb(p(t−1)) from the location indicated by the received address Adrs(Tx(t−1)). The LUTb 108 supplies the read distortion compensation coefficient hb(p(t−1)) to the adder 114. In the same way, the LUTd 112 receives the address Adrs(Tx(t−1)) to supply a distortion compensation coefficient hd(p(t−1)) to the adder 116.

The adder 114 performs synthesis by adding the distortion compensation coefficients ha(p(t)) and hb(p(t−1)) to generate a post-synthesis coefficient h1($p(t)$). The adder 114 supplies the post-synthesis coefficient h1($p(t)$) to the multiplier 118.

The adder 116 performs synthesis by adding the distortion compensation coefficients hc(p(t)) and hd(p(t−1)) to generate a post-synthesis coefficient h2($p(t)$). The adder 116 supplies the generated post-synthesis coefficient h2($p(t)$) to the multiplier 120.

The multiplier 118 receives the transmission signal Tx(t) and post-synthesis coefficient h1($p(t)$). The multiplier 118 multiplies the transmission signal Tx(t) and post-synthesis coefficient h1($p(t)$), thereby generating a transmission signal Tx1($t$). The multiplier 118 supplies the generated transmission signal Tx1($t$) to the adder 124.

The delay unit 122 outputs the transmission signal Tx(t) by delaying output by time equivalent to difference between the current reference point-in-time and the previous reference point-in-time, thereby generating a transmission signal Tx(t−1) at the previous reference point-in-time t−1. The delay unit 122 supplies the generated transmission signal Tx(t−1) to the multiplier 120.

The multiplier 120 receives the transmission signal Tx(t−1) and post-synthesis coefficient h2($p(t)$). The multiplier 120 multiplies the transmission signal Tx(t−1) and post-synthesis coefficient h2($p(t)$), thereby generating a transmission signal Tx2($t$). The multiplier 118 supplies the generated transmission signal Tx2($t$) to the adder 124.

The adder 124 adds the transmission signals Tx1($t$) and Tx2($t$), thereby generating a pre-distortion signal PD(t). The pre-distortion signal PD(t) is a signal generated by subjecting the transmission signal Tx(t) input to the distortion compensation apparatus 100 to distortion compensation processing, and is a transmission signal after the distortion compensation processing.

A distortion compensation coefficient updating unit 140 receives the pre-distortion signal PD(t) and a feedback signal Fb(t), and also receives the distortion compensation coefficients ha(p(t)), hb(p(t−1)), hc(p(t)), and hd(p(t−1)) from the LUTa 106, LUTb 108, LUTc 110, and LUTd 112 respectively. The feedback signal Fb(t) is a feedback signal generated based on the output signal of a power amplifier not illustrated.

The distortion compensation coefficient updating unit 140 calculates an updated value corresponding to the received distortion compensation coefficient as to each of the look up tables (LUT) based on the received pre-distortion signal PD(t) and feedback signal Fb(t). The distortion compensation coefficient updating unit 140 updates the distortion compensation coefficient correlated with the power value of the transmission signal corresponding to the received distortion compensation coefficient based on the calculated updated value at each LUT.

As described above, with the multi-LUT-type distortion compensation apparatus 100, the delay units 104 and 122 are provided, and correction components of the distortion compensation processing called as delay terms are generated, thereby reflecting the information of the transmission signal Tx(t−1) at the previous reference point-in-time t−1 on the distortion compensation processing as to the transmission signal Tx(t), and accordingly, distortion due to memory effect of the power amplifier can be compensated in addition to nonlinear distortion by the distortion compensation processing.

Figure 2A:
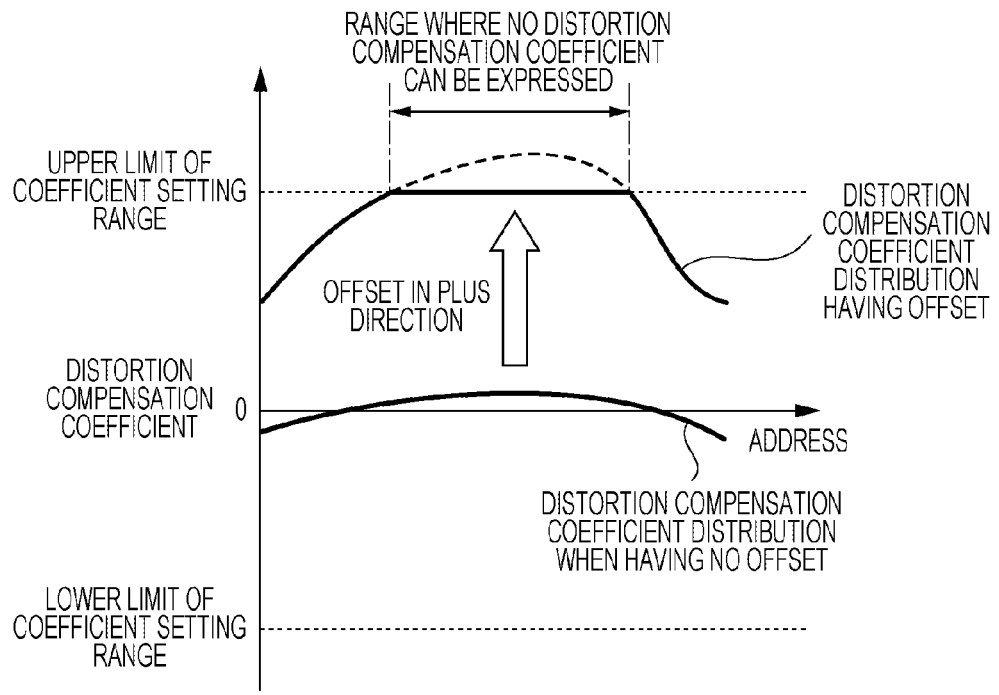
FIGS. 2A and 2B are diagrams illustrating an example of the distributions of the distortion compensation coefficients at LUTs (Look Up Tables) after distortion compensation processing and updating processing of the distortion compensation coefficients during a certain period of time at the distortion compensation apparatus.
Figure 2B:
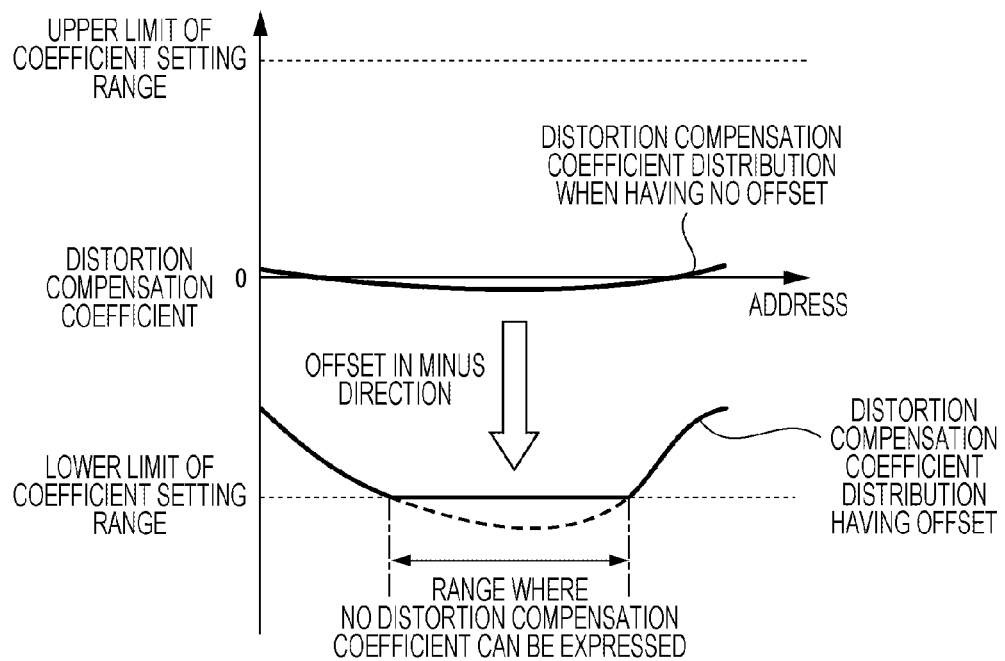

FIGS. 2A and 2B are diagrams illustrating an example of distortion compensation coefficient distributions at the LUTa and LUTb after the distortion compensation processing and updating processing of the distortion compensation coefficients is performed during a certain period of time at the distortion compensation apparatus 100. FIG. 2A represents the distribution of the distortion compensation coefficient at the LUTa 106, and FIG. 2B represents the distribution of the distortion compensation coefficient at the LUTb 108. The vertical axis represents the value of a real portion (I-channel component) or imaginary portion (Q-channel component) of a distortion compensation coefficient, and the horizontal axis represents the corresponding address within a LUT.

The present application inventor has found that, as illustrated in FIGS. 2A and 2B, when performing updating of distortion compensation coefficients at the distortion compensation apparatus 100, in the event that a distortion compensation coefficient has a certain offset at one LUT of the LUTa and LUTb, even at the other LUT, the distortion compensation coefficient consequently has an offset in the opposite direction of the offset generated at one LUT so as to compensate the certain offset thereof.

It can be conceived as an example that this phenomenon is influenced by distortion compensation processing as to the transmission signal Tx(t) using the post-synthesis coefficient $h1(p(t))$ obtained by adding the distortion compensation coefficient $ha(p(t))$ output from the LUTa, and the distortion compensation coefficient $hb(p(t-1))$ output from the LUTb at the multiplier 118.

As a result thereof, a problem is caused wherein, in the event of updating of a distortion compensation coefficient advancing, the distortion compensation coefficient converges exceeding a limited coefficient setting range settable at each LUT with the distortion compensation coefficient distributions at the LUTa and LUTb. Therefore, the distortion compensation coefficient is clipped to the upper limit or lower limit in a limited coefficient setting range, and the distortion compensation performance deteriorates.

For example, in the event that the distortion compensation coefficient has an offset in the plus direction by updating operation at the LUTa, the offset of the distortion compensation of the LUTa is an offset in the plus direction, and accordingly, the value of the distortion compensation coefficient attempts to converge at the LUTb so as to mutually compensate the offsets, i.e., so as to reduce the offset that occurs at the post-synthesis coefficient $h1(p(t))$. Therefore, the offset in the minus direction of the opposite direction of the offset in the plus direction at the LUTa consequently occurs on the distortion compensation coefficient at the LUTb.

Accordingly, with the distortion compensation coefficient distributions at the LUTa and LUTb, in the event of updating of the distortion compensation coefficient advancing, operation is performed so as to mutually compensate the offsets, and accordingly, the distortion compensation coefficient stored in the LUTa increases while having an offset in the plus direction, and the distortion compensation coefficient stored in the LUTb decreases while having an offset in the opposite minus direction.

As a result thereof, as illustrated in FIGS. 2A and 2B, with the distortion compensation coefficient distribution of the LUTa, an address region where the distortion compensation coefficient is clipped to the upper limit of the coefficient setting range occurs, and with the distortion compensation coefficient distribution of the LUTb, an address region where the distortion compensation coefficient is clipped to the lower limit of the coefficient setting range occurs. An address region where the distortion compensation coefficient is clipped fails to express the distortion compensation coefficient to be originally set, and consequently, the distortion compensation performance deteriorates.

Also, with the multiplier 120 as well, distortion compensation processing as to the transmission signal Tx(t) is performed using the post-synthesis coefficient $h2(p(t))$ to be obtained by adding the distortion compensation coefficient $hc(p(t))$ output from the LUTc and the distortion compensation coefficient $hd(p(t-1))$ output from the LUTd. Accordingly, with the LUTc and LUTd as well, in the same way as with the LUTa and LUTb, a problem occurs wherein the distortion compensation performance deteriorates.

1. First Embodiment

Description will be made regarding a wireless communication device and a distortion compensation apparatus according to a first embodiment.

1-1. Configuration Example of Wireless Communication Apparatus 300

FIG. 3 is a diagram illustrating an example of the configuration of a wireless communication device 300 including a multi-LUT-type distortion compensation apparatus 302. As illustrated in FIG. 3, the wireless communication device 300 includes a distortion compensation apparatus 302, a digital/analog converter (DAC) 304, an up converter 306, a reference carrier wave generator 308, a power amplifier 310, a down converter 312, a reference carrier wave generator 314, and an analog/digital converter (ADC) 316.

The distortion compensation apparatus 302 is a multi-LUT-type distortion compensation apparatus, and includes a pre-distortion signal generating unit 322, and a distortion compensation coefficient updating unit 324. The pre-distortion signal generating unit 322 includes multiple LUT, and receives a transmission signal Tx(t) from a transmission signal generating device not illustrated. The pre-distortion signal generating unit 322 synthesizes multiple distortion compensation coefficients stored in the multiple LUT, thereby generating a post-synthesis coefficient, and generating a pre-distortion signal PD(t) based on the received transmission signal Tx(t) and the generated post-synthesis coefficient. The details of the pre-distortion signal generating unit 322 will be described later.

The pre-distortion signal PD(t) is converted into an analog signal by the DAC 304. The up converter 306 receives the converted pre-distortion signal, performs orthogonal modulation using the reference carrier waves supplied from the reference carrier wave generator 308, and also performs frequency conversion into a wireless frequency. The power amplifier 310 receives the pre-distortion signal subjected to the orthogonal modulation and frequency conversion, performs power amplification of the received pre-distortion signal, and generates a wireless transmission signal. The power amplifier 310 transmits the wireless transmission signal in the air via an antenna not illustrated by radio, and also feeds back the wireless transmission signal to the down converter 312.

The down converter 312 receives the wireless transmission signal fed back, performs orthogonal detection using the reference carrier wave generator 314, and also performs frequency conversion into the original baseband frequency. The signal subjected to the orthogonal detection and frequency conversion is converted into a digital signal by the ADC 316, and supplied to the distortion compensation coefficient updating unit 324 as a feedback signal Fb(t).

The distortion compensation coefficient updating unit 324 receives the feedback signal Fb(t), and also receives the pre-distortion signal PD(t) from the pre-distortion signal generating unit 322. Also, the distortion compensation coefficient updating unit 324 receives a distortion compensation coefficient h(p) from the multiple LUT within the pre-distortion signal generating unit 322. The distortion compensation coefficient updating unit 324 performs adaptive signal processing using LMS (Least Mean Square) algorithm for example, thereby updating the value of the distortion compensation coefficient stored in each of the multiple LUT included in the pre-distortion signal generating unit 322.

The distortion compensation coefficient updating unit 324 subjects the feedback signal Fb(t) to the same distortion compensation processing as with the transmission signal Tx(t), thereby generating a reference pre-distortion signal PDref(t). The distortion compensation coefficient updating unit 324 calculates the updated value of the received distortion compensation coefficient h(p) as to each LUT using the adaptive signal processing employing the LMS algorithm so as to obtain zero as difference between the received pre-distortion signal PD(t) and the generated reference pre-distortion signal PDref(t). The distortion compensation coefficient updating unit 324 updates the value of the distortion compensation coefficient within each LUT in a manner correlated with the power value of the corresponding transmission signal based on the calculated updated value. The distortion compensation coefficient updating unit 324 repeatedly executes the above distortion compensation coefficient updating processing, thereby operating so as to have the value of the distortion compensation coefficient within each LUT converge into a certain value corresponding to each power value of the transmission signals. Note that, with regard to distortion compensation coefficient updating processing to be executed at the distortion compensation coefficient updating unit 324, processing described in the Specific and drawings of a prior application (Japanese Patent Application No. 2010-236432) by the present patent applicant can be employed.

Note that the distortion compensation apparatus 302 can be realized with a digital signal processing device such as FPGA, ASIC, or the like, or a processor such as a DSP or the like, for example. Also, the distortion compensation apparatus 302 may be realized as a single device, or may be realized as a combination of multiple devices each having a part of the function of the distortion compensation apparatus 302. Also, the respective LUT included in the distortion compensation apparatus 302 may be realized with a storage device such as independent RAM or the like.

1-2. Configuration Example of Pre-Distortion Signal Generating Unit 322

Figure 4:
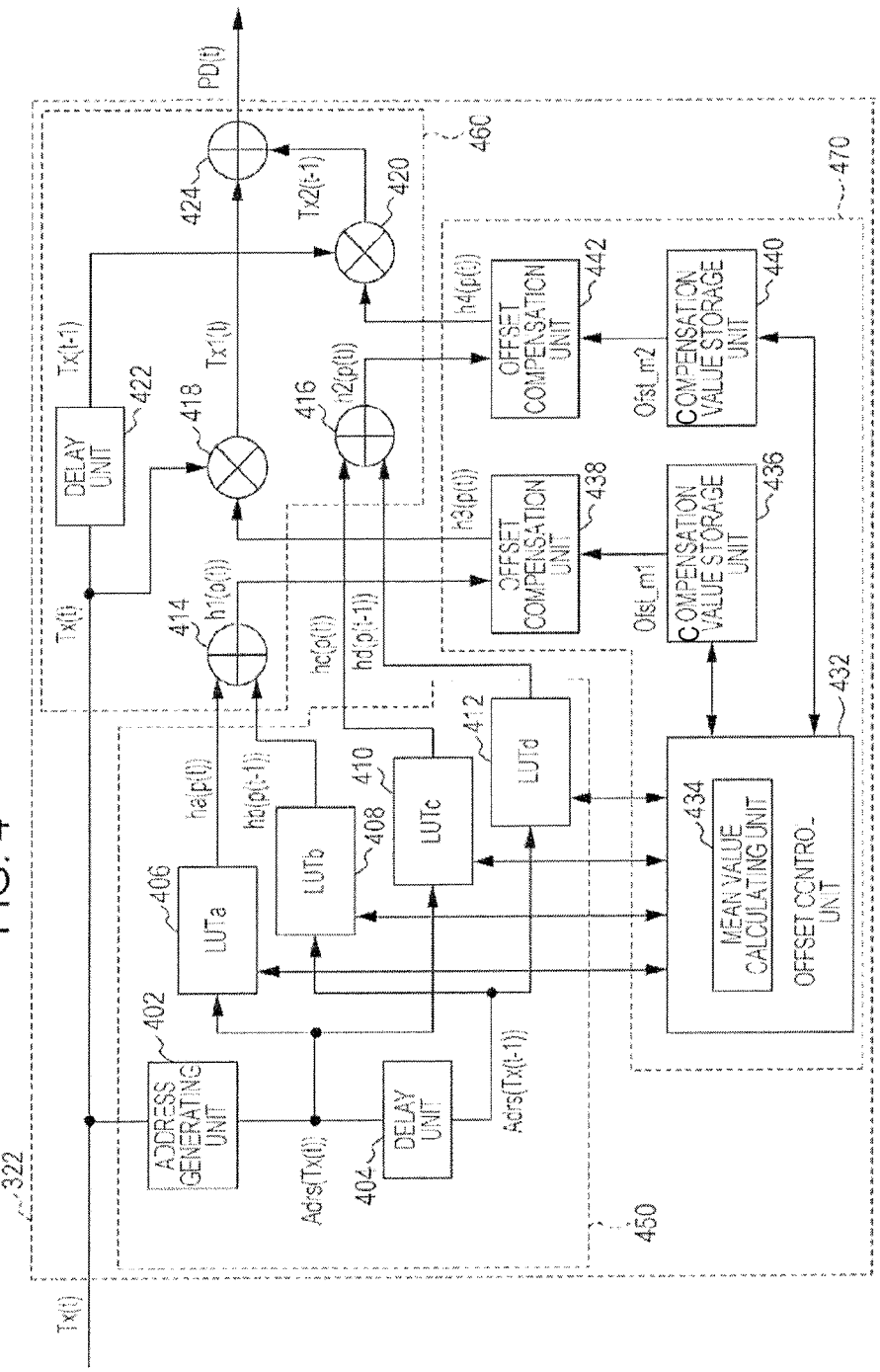
FIG. 4 is a diagram illustrating an example of the internal configuration of a pre-distortion signal generating unit according to the first embodiment.
Figure 5:
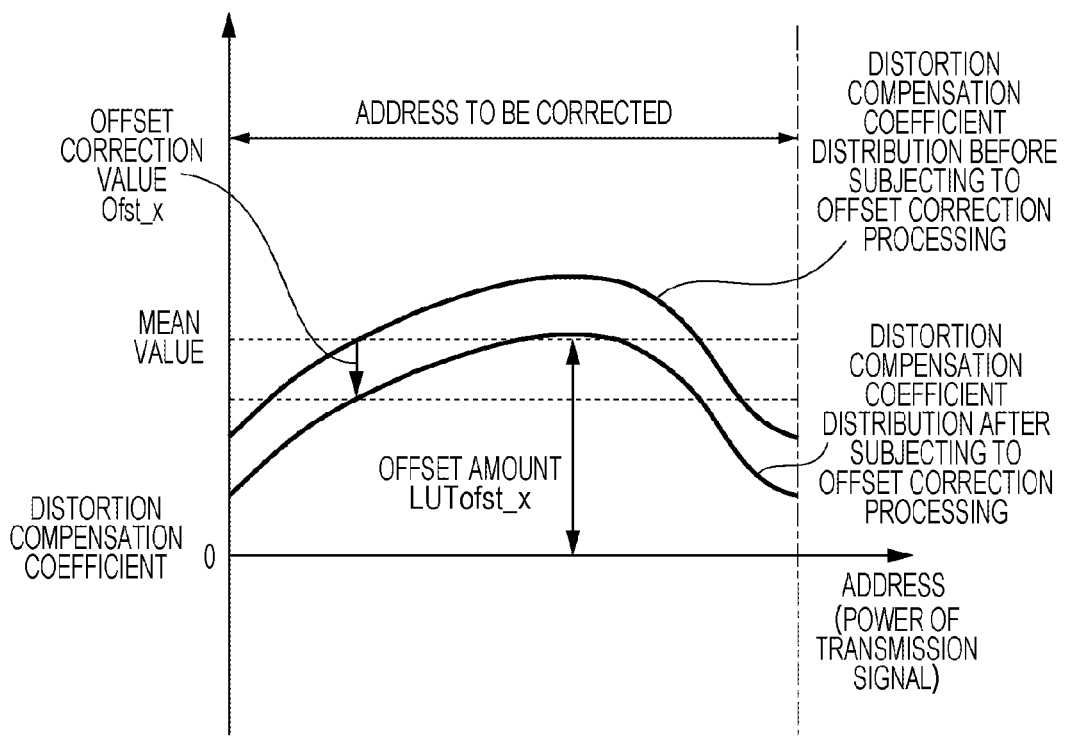
FIG. 5 is a diagram for describing distortion compensation coefficient correction processing at the pre-distortion signal generating unit according to the first embodiment.

FIG. 4 is a diagram illustrating an example of the internal configuration of the pre-distortion signal generating unit 322. FIG. 5 is a diagram for describing distortion compensation coefficient correction processing at the pre-distortion signal generating unit 322. Hereafter, description will be made regarding a configuration example of the pre-distortion signal generating unit 322 using FIGS. 4 and 5.

As illustrated in FIG. 4, the pre-distortion signal generating unit 322 includes a distortion compensation coefficient supplying unit 450, a distortion compensation processing unit 460, and an offset correction processing unit 470.

The distortion compensation coefficient supplying unit 450 includes an address generating unit 402, a delay unit 404, a LUTa (look up table) 406, a LUTb 408, a LUTc 410, and a LUTd 412. The distortion compensation processing unit 460 includes adders 414 and 416, multipliers 418 and 420, and a delay unit 422, and an adder 424.

The look up tables LUTa 406 through LUTd 412 are distortion compensation coefficient storage units which store a distortion compensation coefficient, and are RAM, for example. The LUTa 406 through LUTd 412 store multiple distortion compensation coefficients ha(p(t)) through hd(p(t)) in an address correlated with the power value p(t) of the transmission signal Tx(t) respectively. Each LUT correlates the address of each LUT with the power value p(t) of the transmission signal Tx(t) in a one-on-one manner, for example, and the higher the power value p(t) of the transmission signal Tx(t) is, stores the corresponding distortion compensation coefficient h(p(t)) in an address having a greater value.

The offset correction processing unit 470 includes an offset control unit 432, compensation value storage units 436 and 440, and offset compensation units 438 and 442. The offset control unit 432 includes a mean value calculating unit 434.

With the offset correction processing unit 470, the offset control unit 432 individually executes the following offset amount calculation processing and offset correction processing regarding each of the LUTa 406 through LUTd 412.

The offset control unit 432 selects a LUT to be processed out of the LUTa 406 through LUTd 412. At the selected LUT for processing, the offset control unit 432 reads out all of the distortion compensation coefficients $h(p_i)$ from an address $A_i$ within the region of an address where the distortion compensation coefficient to be corrected is stored.

As illustrated in FIG. 5, the mean value calculating unit 434 performs addition averaging operation indicated with the following Expression 1 regarding all of the read distortion compensation coefficients $h(p_i)$ to calculate a mean value. The offset control unit 432 calculates the mean value of the distortion compensation coefficients using the mean value calculating unit 434, thereby performing calculation processing of offset amount LUTofst_x (x is any of a through d) of the distortion compensation coefficient as to a LUT_x to be processed.

$$\text{LUTofst\_x} = \frac{\sum_{A_i=adrsMin}^{adrsMax} h(p_i)}{N} \quad \text{[Expression 1]}$$

Here, with Expression 1, LUTofst_x is the offset amount of the distortion compensation coefficient within the LUT_x, adrsMax is the maximum value of the address to be corrected, adrsMin is the minimum value of the address to be corrected, $h(p_i)$ is a distortion compensation coefficient stored in the address $A_i$ of the LUT_x, and N is the number of addresses from the address minimum value adrsMin to maximum value adrsMax to be corrected.

Note that the distortion compensation coefficient h(p(t)) is expressed with a complex number, and accordingly, the above-mentioned offset amount calculation processing is individually executed as to each of the real portion (I-channel component) and imaginary portion (Q-channel component) of a distortion compensation coefficient. Also, this can similarly be applied to later-described processing such as offset correction value setting processing, offset correction processing, offset compensation value updating processing, offset compensation processing, and so forth, and processing such as distortion compensation processing, distortion compensation coefficient updating processing, and so forth.

The offset control unit 432 performs the setting processing of the offset correction value Ofst_x as to the LUT_x to be processed based on the calculated offset amount LUTofst_x. The offset control unit 432 changes the offset correction value Ofst_x to a different value according to whether the calculated offset amount LUTofst_x is a positive value or negative value. The details of the offset correction value setting processing will be described later.

The offset control unit 432 performs offset correction processing as to all of the distortion compensation coefficients stored within the address region to be corrected based on the set offset correction value Ofst_x at the LUT_x to be processed. The offset control unit 432 performs, as illustrated in FIG. 5 for example, the correction processing of the offset of each distortion compensation coefficient based on the set offset correction value Ofst_x so as reduce the magnitude (absolute value) of the offset amount of each distortion compensation coefficient stored in the LUT to be processed. The offset control unit 432 writes the distortion compensation coefficient subjected to the offset compensation processing in the address corresponding to the LUT_x to be processed, thereby correcting the offset of the distortion compensation coefficient within the LUT to be processed. The details of the offset correction processing will be described later.

According to repeating the above-mentioned processing regarding the LUTa 406 through LUTd 412, the offset control unit 432 calculates offset amount LUTofst_a through offset amount LUTofst_d as to the LUTa 406 through LUTd 412, performs processing for setting offset correction values Ofst_a through Ofst_d, and also performs the offset correction processing as to each of the LUTa 406 through LUTd 412.

The offset control unit 432 performs updating processing of the offset compensation values within the compensation value storage unit 436 based on the calculated offset amount LUTofst_a and offset amount LUTofst_b. The offset control unit 432 calculates the updated value of an offset compensation value Ofst_m1 based on the offset amount LUTofst_a and offset amount LUTofst_b, and stores the calculated updated value of the offset compensation value Ofst_m1 in the compensation value storage unit 436. The offset compensation value Ofst_m1 corresponds to a value obtained by accumulatively adding a difference value (offset correction value) between distortion compensation coefficients before and after the above offset correction processing at the LUTa 406, and a difference value (offset correction value) between distortion compensation coefficients before and after the above offset correction processing at the LUTb 408. The details of the updating processing of an offset compensation value will be described later.

Similarly, the offset control unit 432 performs updating processing of the offset compensation values within the compensation value storage unit 440 based on the calculated offset amount LUTofst_c and offset amount LUTofst_d. The offset control unit 432 calculates the updated value of an offset compensation value Ofst_m2 based on the offset amount LUTofst_c and offset amount LUTofst_d, and stores the calculated updated value of the offset compensation value Ofst_m2 in the compensation value storage unit 440. The offset compensation value Ofst_m2 corresponds to a value obtained by accumulatively adding a difference value (offset correction value) between distortion compensation coefficients before and after the above offset correction processing at the LUTc 410, and a difference value (offset correction value) between distortion compensation coefficients before and after the above offset correction processing at the LUTd 412.

With the distortion compensation coefficient supplying unit 450, the address generating unit 402 receives the transmission signal Tx(t), generates an address Adrs(Tx(t)) corresponding to the power value p(t) of the transmission signal Tx(t). For example, the address generating unit 402 correlates the power value p(t) of the transmission signal Tx(t) with the address Adrs(Tx(t)) in a one-on-one manner, and the higher the power value p(t) of the transmission signal Tx(t) is, generates an address Adrs(Tx(t)) having a greater value. The generated address Adrs(Tx(t)) is supplied to the LUTa 406 and LUTc 410.

The delay unit 404 receives the address Adrs(Tx(t)) generated by the address generating unit 402. The delay unit 404 outputs the received address Adrs(Tx(t)) by delaying the output of the received address Adrs(Tx(t)) by time equivalent to the previous reference point-in-time, thereby generating an address Adrs(Tx(t−1)) corresponding to the power value p(t−1) of the transmission signal Tx(t−1) at the previous reference point-in-time t−1. The generated address Adrs(Tx(t−1)) is supplied to the LUTb 408 and LUTd 412.

The LUTa 406 receives the address Adrs(Tx(t)), and reads out the corresponding distortion compensation coefficient ha(p(t)) output from the received address Adrs(Tx(t)). The LUTa 406 outputs the read distortion compensation coefficient ha(p(t)) to the adder 414. The distortion compensation coefficient ha(p(t)) from the LUTa 406 is a distortion compensation coefficient after the offset correction processing by the offset control unit 432. Also, similarly, the LUTc 410 receives the address Adrs(Tx(t)), and outputs the corresponding distortion compensation coefficient hc(p(t)) to the adder 416. The distortion compensation coefficient hc(p(t)) output from the LUTc 410 is a distortion compensation coefficient after the offset correction processing.

The LUTb 408 receives the address Adrs(Tx(t−1)), and reads out the corresponding distortion compensation coefficient hb(p(t−1)) from the received address Adrs(Tx(t−1)). The LUTb 408 outputs the read distortion compensation coefficient hb(p(t−1)) to the adder 414. The distortion compensation coefficient hb(p(t)) output from the LUTb 408 is a distortion compensation coefficient after the offset correction processing by the offset control unit 432. Also, similarly, the LUTd 412 receives the address Adrs(Tx(t−1)), and outputs the corresponding distortion compensation coefficient hd(p(t−1)) to the adder 416. The distortion compensation coefficient hd(p(t)) output from the LUTd 412 is a distortion compensation coefficient after the offset correction processing.

With the distortion compensation processing unit 460, the adder 414 receives the distortion compensation coefficients ha(p(t)) and hb(p(t−1)) from the LUTa 406 and LUTb 408. The adder 414 performs synthesis by adding the distortion compensation coefficients ha(p(t)) and hb(p(t−1)) to generate a post-synthesis coefficient $h1(p(t))$. The adder 414 outputs the post-synthesis coefficient $h1(p(t))$ to the offset compensation unit 438.

$$h1(p(t)) = ha(p(t)) + hb(p(t-1))$$

Similarly, the adder 416 receives the distortion compensation coefficients hc(p(t)) and hd(p(t−1)) from the LUTc 410 and LUTd 412. The adder 416 performs synthesis by adding the distortion compensation coefficients hc(p(t)) and hd(p(t−1)) to generate a post-synthesis coefficient $h2(p(t))$. The adder 416 outputs the post-synthesis coefficient $h2(p(t))$ to the offset compensation unit 442.

$$h2(p(t)) = hc(p(t)) + hd(p(t-1))$$

The offset compensation unit 438 receives the post-synthesis coefficient $h1(p(t))$ from the adder 414, and also receives the offset compensation value Ofst_m1 from the compensation value storage unit 436. The offset compensation unit 438 adds the offset compensation value Ofst_m1 to the received post-synthesis coefficient $h1(p(t))$, thereby performing offset compensation processing as to the post-synthesis coefficient $h1(p(t))$ to generate a post-offset-compensation coefficient $h3(p(t))$.

$$h3(p(t)) = h1(p(t)) + \text{Ofst}\_m1$$

The offset compensation unit 438 outputs the generated post-offset-compensation coefficient h3($p(t)$) to the multiplier 418. The post-offset-compensation coefficient h3($p(t)$) corresponds to a value obtained by adding the distortion compensation coefficient in the case that the offset correction processing by the offset control unit 432 has not been performed at the LUTa 406, and the distortion compensation coefficient in the case that the offset correction processing has not been performed at the LUTb 408, and is an additional value in the case that the offset correction processing has not been performed using the offset compensation value Ofst_m1 generated in a pseudo manner.

The offset compensation unit 442 receives the post-synthesis coefficient h2($p(t)$) from the adder 416, and also receives the offset compensation value Ofst_m2 from the compensation value storage unit 440. The offset compensation unit 442 adds the offset compensation value Ofst_m2 to the received post-synthesis coefficient h2($p(t)$), thereby performing offset compensation processing as to the post-synthesis coefficient h2($p(t)$) to generate a post-offset-compensation coefficient h4($p(t)$).

$$h4(p(t))=h2(p(t))+\text{Ofst\_m2}$$

The offset compensation unit 442 outputs the generated post-offset-compensation coefficient h4($p(t)$) to the multiplier 420. The post-offset-compensation coefficient h4($p(t)$) corresponds to a value obtained by adding the distortion compensation coefficient in the case that the offset correction processing by the offset control unit 432 has not been performed at the LUTc 410, and the distortion compensation coefficient in the case that the offset correction processing has not been performed at the LUTd 412, and is an additional value in the case that the offset correction processing has not been performed using the offset compensation value Ofst_m2 generated in a pseudo manner.

The multiplier 418 receives the transmission signal Tx(t), and also receives the post-offset-compensation coefficient h3($p(t)$) from the offset compensation unit 438. The multiplier 418 multiplies the transmission signal Tx(t) and post-offset-compensation coefficient h3($p(t)$) to generate a transmission signal Tx1($t$). The multiplier 418 outputs the generated transmission signal Tx1($t$) to the adder 424.

$$Tx1(t)=Tx(t)\times h3(p(t))$$

The delay unit 422 outputs the transmission signal Tx(t) by delaying the output of the transmission signal Tx(t) by time equivalent to the previous reference point-in-time, thereby generating a transmission signal Tx(t−1)) at the previous reference point-in-time t−1. The delay unit 422 outputs the generated transmission signal Tx(t−1) to the multiplier 420.

The multiplier 420 receives the transmission signal Tx(t−1) from the delay unit 422, and also receives the post-offset-compensation coefficient h4($p(t)$) from the offset compensation unit 442. The multiplier 420 multiplies the transmission signal Tx(t−1) and post-offset-compensation coefficient h4($p(t)$) to generate a transmission signal Tx2($t$−1). The multiplier 420 outputs the generated transmission signal Tx2($t$−1) to the adder 424.

$$Tx2(t-1)=Tx(t-1)\times h4(p(t))$$

The adder 424 adds the transmission signals Tx1($t$) and Tx2($t$−1), thereby generating a pre-distortion signal PD(t). The pre-distortion signal PD(t) is a transmission signal after the transmission signal Tx(t) input to the distortion compensation apparatus 302 is subjected to distortion compensation processing.

$$PD(t)=Tx1(t)+Tx2(t-1)$$

As described above, with the multi-LUT-type distortion compensation apparatus 302, a delay term is generated by the delay units 404 and 422 as to the transmission signal Tx(t), thereby reflecting the information of the transmission signal Tx(t−1) at the previous reference point-in-time t−1 on the distortion compensation processing as to the transmission signal Tx(t), and accordingly, distortion due to memory effect of the power amplifier can be compensated in addition to nonlinear distortion of the power amplifier.

Also, with the pre-distortion signal generating unit 322 of the distortion compensation apparatus 302, the offset amount of the distortion compensation coefficient is calculated at each of the look up tables LUTa 406 through LUTd 412, and the offset correction processing of each distortion compensation coefficient based on the calculated offset amount so as to reduce the offset amount of the distortion compensation coefficient. Accordingly, at each LUT, even in the event of updating of the distortion compensation coefficient advancing, the offset of the distortion compensation coefficient monotonously increases or decreases in one direction. As a result thereof, the distortion compensation coefficient can be suppressed from being clipped to the upper limit or lower limit of the coefficient setting range. Accordingly, with the distortion compensation apparatus 302, the distortion compensation performance can be suppressed from deteriorating.

Further, with the distortion compensation apparatus 302, according to the offset compensation units 438 and 442, a distortion compensation coefficient in the case that the offset correction processing at each LUT has not been performed is generated in a pseudo manner, and the distortion compensation processing of the transmission signal Tx(t) is performed based on the distortion compensation coefficient before the offset correction processing generated in a pseudo manner. Thus, with the distortion compensation apparatus 302, even in the event that the value of the distortion compensation coefficient stored in each LUT has been corrected by the offset correction processing, suitable distortion compensation processing can be performed using the distortion compensation coefficient generated in a pseudo manner, and the precision of the distortion compensation processing can be maintained.

1-3. Example of Correction and Updating Operation of Distortion Compensation Coefficient at Distortion Compensation Apparatus 302

Figure 6:
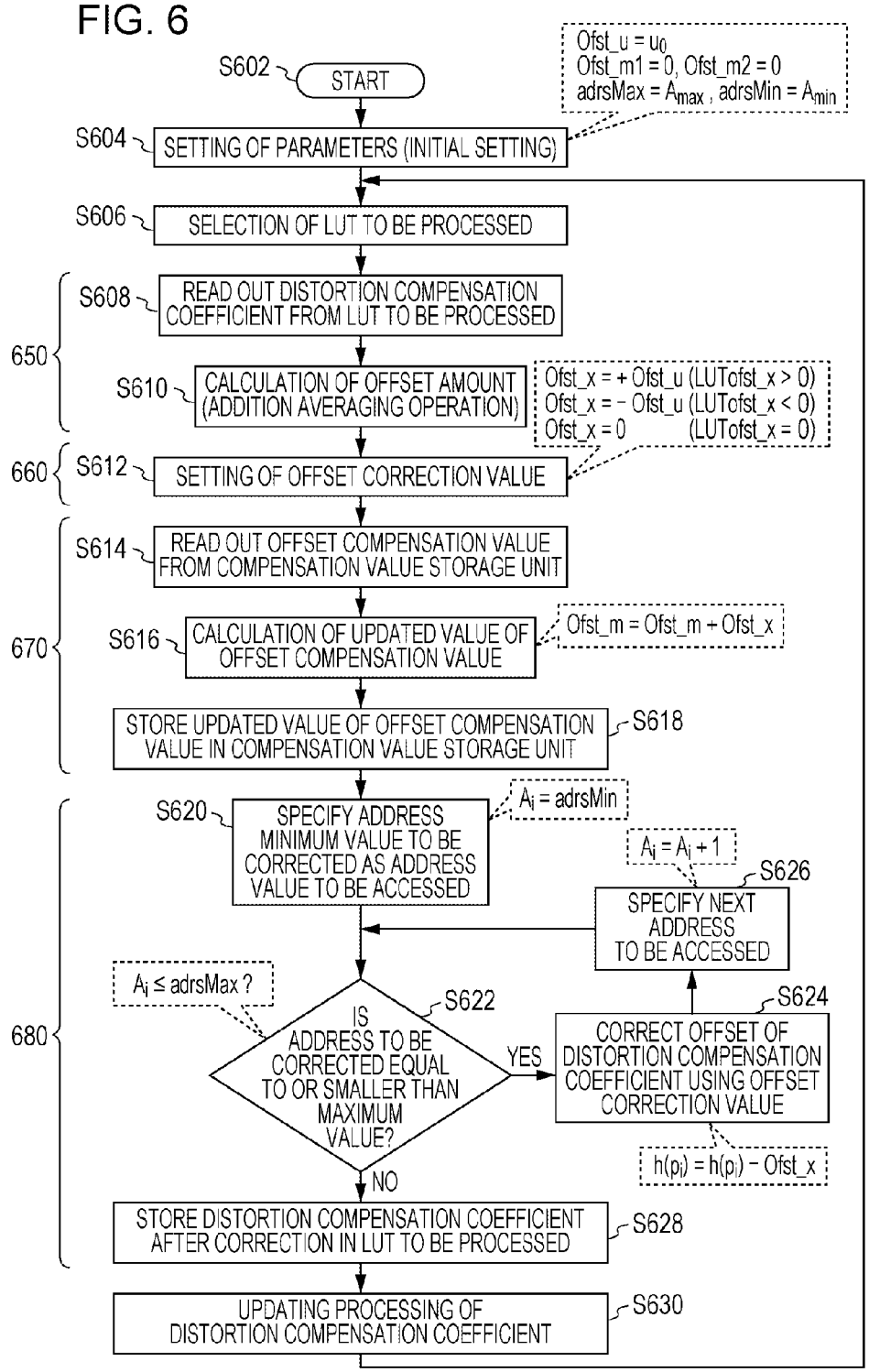
FIG. 6 is a diagram illustrating an example of a flowchart of distortion compensation coefficient correction and updating processing at the distortion compensation apparatus according to the first embodiment.

FIG. 6 is a diagram illustrating an example of a flowchart of distortion compensation coefficient correction and updating processing at the distortion compensation apparatus 302. Hereafter, description will be made regarding the distortion compensation coefficient correction and updating processing that the distortion compensation apparatus 302 executes, using the flowchart in FIG. 6. Note that, with the flowchart in FIG. 6, a numeric expression relating to the processing of the corresponding step is indicated in a portion surrounded by a dotted line.

First, in step S602, the distortion compensation apparatus 302 starts correction and updating processing of a series of distortion compensation coefficients.

Next, in step S604, the offset control unit 432 of the offset correction processing unit 470 sets parameters used for later-described offset correction value setting processing 660, offset compensation value updating processing 670, and offset correction processing 680 as initial setting. Examples of the parameters to be set include the offset correction unit Ofst_u to be used for the offset correction value setting processing, the address minimum value adrsMin and maximum value adrsMax within each LUT where a distortion compensation coefficient to be corrected in the offset correction processing is stored, and offset compensation values Ofst_m1 and Ofst_m2 to be stored in the compensation value storage units 436 and 440 in the offset compensation value updating processing.

Though not particularly restricted, a certain positive value $u_o$ is set as the offset correction unit Ofst_u, and 0 (zero) is set as the offset compensation values Ofst_m1 and Ofst_m2.

$$Ofst\_u = u_o$$

$$Ofst\_m1=0, Ofst\_m2=0$$

Also, though not particularly be restricted, the minimum value $A_{min}$ and maximum value $A_{max}$ of addresses where a correction coefficient is stored in the respective LUT are set as the address minimum value adrsMin and maximum value adrsMax to be corrected, respectively.

$$adrsMin=A_{min}$$

$$adrsMax=A_{max}$$

Next, in step S606, the offset control unit 431 selects one LUT to be processed out of the LUTa 406 through LUTd 412. The offset control unit 432 cyclically selects the corresponding LUT in the sequence of LUTa 406, LUTb 408, LUTc 410, LUTd 412, LUTa 406, LUTb 408, and so on, for example.

Next, in step S608, the offset control unit 432 reads out the distortion compensation coefficient $h(p_i)$ from the LUT to be processed selected in step S606. At this time, the offset control unit 432 reads out the distortion compensation coefficient $h(p_i)$ from all of the addresses in a range from the address minimum value adrsMin to maximum value adrsMax.

Next, in step S610, the offset control unit 432 performs the addition averaging operation indicated in the above Expression 1 regarding all of the distortion compensation coefficient h(p(t)) read out in step S608. According to this addition averaging operation, the offset control unit 432 performs processing for calculating the offset amount LUTofst_x of the distortion compensation coefficient as to the LUTx to be processed (x is any of a through d).

Note that the distortion compensation coefficient h(p) is expressed with a complex number, and accordingly, the above-mentioned offset amount calculation processing is individually executed as to each of the real portion (I-channel component) and imaginary portion (Q-channel component) of a distortion compensation coefficient. Also, this can similarly be applied to later-described processing such as offset correction value setting processing, offset correction processing, offset compensation value updating processing, and so forth, which will be executed in later-described steps.

Next, in step S612, the offset control unit 432 determines whether the calculated offset amount LUTofst_x is 0 (zero), a positive value, or a negative value.

When determining that the offset amount LUTofst_x is a positive value (LUTofst_x>0), the offset control unit 432 performs processing for setting the offset correction value Ofst_x as to the LUTx to be processed using the offset correction unit Ofst_u as follows. Specifically, the offset control unit 432 sets the certain positive value $u_o$ as the offset correction value.

$$Ofst\_x=+Ofst\_u=+u_o$$

When determining that the offset amount LUTofst_x is a negative value (LUTofst_x<0), the offset control unit 432 performs processing for setting the offset correction value Ofst_x as to the LUTx to be processed using the offset correction unit Ofst_u as follows. Specifically, the offset control unit 432 sets the certain negative value $u_o$ as the offset correction value.

$$Ofst\_x=-Ofst\_u=-u_o$$

When determining that the offset amount LUTofst_x is 0 (zero) (LUTofst_x=0), the offset control unit 432 performs processing for setting the offset correction value Ofst_x as to the LUTx to be processed as follows. Specifically, the offset control unit 432 sets the offset correction value to 0 (zero).

$$Ofst\_x=0$$

According to the above steps S608 through S612, the offset amount calculation processing 650 and offset correction value setting processing 660 are performed at the offset correction processing unit 470.

Next, in step S614, the offset control unit 432 reads out the offset correction values Ofst_m1 and Ofst_m2 from the compensation value storage unit 436 or 440, and sets the read offset correction value as the updated value Ofst_m of the offset correction value.

Here, in the event that the LUT to be processed selected in step S606 is the LUTa or LUTb, the offset control unit 432 reads out the offset compensation value Ofst_m1 stored in the compensation value storage unit 436, and sets the read offset compensation value Ofst_m1 as the updated value Ofst_m.

$$Ofst\_m=Ofst\_m1$$

Also, in the event that the selected LUT to be processed is the LUTc or LUTd, the offset control unit 432 reads out the offset compensation value Ofst_m2 stored in the compensation value storage unit 440, and sets the read offset compensation value Ofst_m2 as the updated value Ofst_m.

$$Ofst\_m=Ofst\_m2$$

Next, in step S616, the offset control unit 432 adds the offset correction value Ofst_x set in step S612 to the updated value Ofst_m set in step S614, and calculates the additional value as a new updated value Ofst_m.

$$Ofst\_m=Ofst\_m+Ofst\_x$$

Next, in step S618, the offset control unit 432 stores the updated value Ofst_m of the offset compensation value calculated in step S616 in the compensation value storage unit 436 or 440, and updates the offset compensation value Ofst_m1 or Ofst_m2 within the compensation value storage unit 436 or 440.

Here, in the event that the LUT to be processed selected in step S606 is the LUTa or LUTb, the offset control unit 432 stores the updated value Ofst_m of the offset compensation value in the compensation value storage unit 436, and updates the offset compensation value Ofst_m1 within the compensation value storage unit 436.

Also, in the event that the LUT to be processed selected in step S606 is the LUTc or LUTd, the offset control unit 432 stores the updated value Ofst_m of the offset compensation value in the compensation value storage unit 440, and updates the offset compensation value Ofst_m2 within the compensation value storage unit 440.

According to the above steps S614 through S618, the offset compensation value updating processing 670 is performed at the offset correction processing unit 470.

Next, in step S620, the offset control unit 432 specifies the address minimum value adrsMin to be corrected ($=A_{min}$) set in step S604 to the value of the address $A_i$ to be accessed within the LUT to be processed selected in step S606. An address to be accessed within the LUT to be processed corresponds to the address where the distortion compensation coefficient to be subjected to the offset correction processing is stored.

$$A_i=adrsMin=A_{min}$$

Next, in step S622, the offset control unit 432 determines whether or not the value of the specified address $A_i$ to be accessed is equal to or smaller than the address maximum value adrsMax to be corrected set in step S604. In the event that the specified address $A_i$ to be accessed is equal to or smaller than the maximum value adrsMax, the processing proceeds to step S624. In the event that the specified address is greater than the maximum value adrsMax, the processing proceeds to step S628.

Next, in step S624, the offset control unit 432 reads out the corresponding distortion compensation coefficient $h(p_i)$ from the address $A_i$ to be accessed, specified within the LUT to be processed. The offset control unit 432 subtracts the offset correction value Ofst_x set in step S612 from the read distortion compensation coefficient $h(p_i)$ to calculate the subtraction value as the value of the distortion compensation coefficient $h(p_i)$ after correction. The offset control unit 432 writes the calculated distortion compensation coefficient $h(p_i)$ after correction in the address $A_i$ to be accessed and processed, thereby correcting the distortion compensation coefficient $h(p_i)$.

$$h(p_i)=h(p_i)-\text{Ofst\_}x$$

Next, in step S626, the offset control unit 432 increments the value of the address $A_i$ within the LUT to be processed by one for example, thereby specifying the value of an address that has a greater value next to the current address, and can be specified as an address value to be accessed, as the value of the next address to be accessed within the LUT to be processed. After the value of the next address $A_i$ is specified, the processing returns to step S622.

$$A_i=A_i+1$$

Next, in step S628, the offset control unit 432 stores the distortion compensation coefficient $h(p_i)$ after correction calculated in step S624 in the address $A_i$ of the LUT to be processed regarding all of the addresses in a range from the address minimum value adrsMin to the maximum adrsMax, and corrects the value of the distortion compensation coefficient in the address $A_i$. Thus, all of the distortion compensation coefficients to be corrected within the LUT to be processed are subjected to the offset correction processing.

According to the above steps S620 through S628, the offset correction processing 680 is performed at the offset correction processing unit 470.

A series of processing performed by the above steps S604 through S628 is distortion compensation coefficient correction processing that the distortion compensation apparatus 302 executes.

Next, in step S630, the distortion compensation coefficient updating unit 324 receives the distortion compensation coefficient h(p(t)) from the multiple LUT within the pre-distortion signal generating unit 322. The distortion compensation coefficient that the distortion compensation coefficient updating unit 324 receives is a coefficient subjected to the offset correction processing 680. The distortion compensation coefficient updating unit 324 further receives a feedback signal Fb(t) from the ADC 316, and also receives the pre-distortion signal PD(t) from the pre-distortion signal generating unit 322. The pre-distortion signal PD(t) is a signal generated based on a distortion compensation coefficient subjected to the offset compensation processing using the offset compensation value updated by the offset compensation value updating processing 670.

In step S630, the distortion compensation coefficient updating unit 324 calculates the updated value of the distortion compensation coefficient as to each LUT based on the received distortion compensation coefficient h(p(t)), pre-distortion signal PD(t), and feedback signal Fb(t). Calculation of the updated value of the distortion compensation coefficient is as described above. With an address within each LUT where the received distortion compensation coefficient is stored, based on the calculated updated value, the distortion compensation coefficient updating unit 324 updates the value of the distortion compensation coefficient. After the distortion compensation coefficient updating processing, the processing returns to step S606.

In step S606, the offset control unit 432 selects another LUT out of the LUTa 406 through LUTd 412 as the next LUT to be processed. The offset control unit 432 performs the processing in the above steps S608 through S628 regarding the selected LUT to be processed to perform the offset amount calculation processing 650, offset correction value setting processing 660, offset compensation value updating processing 670, and offset correction processing 680 respectively.

As described above, with the distortion compensation coefficient correction and updating processing illustrated in FIG. 6, the offset amount of the distortion compensation coefficient at each of the LUTa 406 through LUTd 412 can be calculated by the offset amount calculation processing 650, and the value of each distortion compensation coefficient can be corrected by the offset correction processing 680 based on the calculated offset amount so as to reduce the magnitude (absolute value) of the offset amount thereof.

Thus, even in the event that the distortion compensation coefficient updating processing has advanced at each LUT, the offset of the distortion compensation coefficient can be suppressed from monotonously increasing or decreasing in one direction, and accordingly, the distortion compensation performance can be suppressed by clipping the distortion compensation coefficient to the upper limit or lower limit in the coefficient setting range.

Further, with the distortion compensation coefficient correction and updating processing illustrated in FIG. 6, according to the offset compensation value updating processing 670, offset compensation values corresponding to the additional value of the distortion compensation coefficients from the LUTa and LUTb (the output value of the adder 414), and the additional value of the distortion compensation coefficients from the LUTc and LUTd (the output value of the adder 416) can be suitable set. Thus, a distortion compensation coefficient in the event that the offset correction processing at each LUT has not been performed is generated in a pseudo manner, and the distortion compensation processing of a transmission signal can be performed based on the distortion compensation coefficient generated in a pseudo manner before the offset correction processing.

Accordingly, even in the event that the value of the distortion compensation coefficient stored in each LUT has been corrected by the offset correction processing 680, suitable distortion compensation processing can be performed using the distortion compensation coefficient generated in a pseudo manner, and accordingly, the precision of the distortion compensation processing can be maintained.

Further, with the distortion compensation coefficient correction and updating processing illustrated in FIG. 6, according to the offset correction value setting processing 660, a suitable value according to the offset amount calculated by the offset amount calculation processing 650 can be set as the offset correction value as to the distortion compensation coefficient within each LUT. Thus, the offset amount of the distortion compensation coefficient can be suitably controlled at each LUT so as to reduce the magnitude (absolute value) thereof.

Also, with the offset correction processing unit 680, the offset of the distortion compensation coefficient within each LUT is corrected independently from the distortion compensation coefficient updating processing at the distortion compensation coefficient updating unit 324, and accordingly, this can be conceived to affect convergence of a distortion compensation coefficient in the updating processing. However, with the distortion compensation coefficient correction and updating processing illustrated in FIG. 6, the value of the offset correction unit Ofst_u used for the offset correction value setting processing 660 is suitably adjusted, whereby the offset correction processing 680 can suppress influence to be applied to the convergence of a distortion compensation coefficient small in the distortion compensation coefficient updating processing.

Accordingly, with the distortion compensation coefficient correction and updating processing illustrated in FIG. 6, the distortion compensation performance can be suppressed from deterioration due to clipping of a distortion compensation coefficient while maintaining the precision of the distortion compensation processing.

Note that, with the above embodiment, an arrangement has been made wherein the delay units are provided to the transmission signal Tx(t) and address Adrs(Tx(t)) one at a step, and one delay term is provided to each, but the present disclosure is not restricted to this. An arrangement may be made wherein delay units are provided to the transmission signal Tx(t) and address Adrs(Tx(t)) i steps and j steps respectively, and i delay terms and j delay terms are provided thereto respectively (however, i and j are integers equal to one or greater than one).

2. Second Embodiment

Hereafter, description will be made regarding a wireless communication device and a distortion compensation apparatus, according to a second embodiment.

2-1. Configuration Example of Pre-Distortion Signal Generating Unit 722

Though the configuration of a wireless communication device 700 according to the second embodiment differs from the configuration of the wireless communication device 300 illustrated in FIG. 3 in that a distortion compensation apparatus 702 and a pre-distortion signal generating unit 722 are provided instead of the distortion compensation apparatus 302 and pre-distortion signal generating unit 322, portions other than those are the same. Accordingly, with regard to the configuration of the wireless communication apparatus 700, drawing thereof is omitted.

Figure 7:
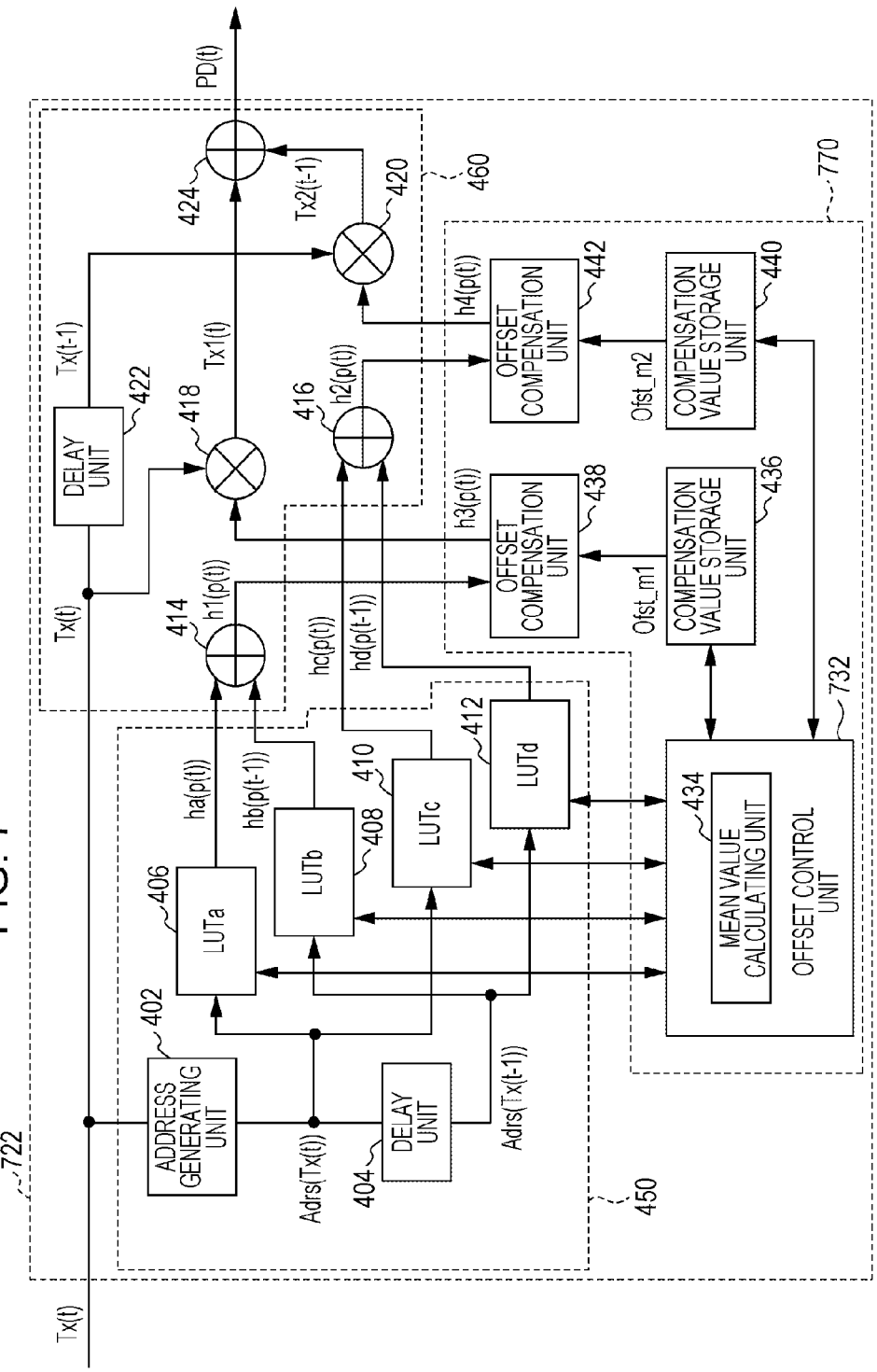
FIG. 7 is a diagram illustrating an example of the internal configuration of a pre-distortion signal generating unit according to a second embodiment.

FIG. 7 is a diagram illustrating an example of the internal configuration of the pre-distortion signal generating unit 722. Though the internal configuration of the pre-distortion signal generating unit 722 differs from the internal configuration of the pre-distortion signal generating unit 322 illustrated in FIG. 4 in that an offset control unit 732 and an offset correction processing unit 770 are provided instead of the offset control unit 432 and offset correction processing unit 470, portions other than those are the same. In FIG. 7, the same or corresponding portions are denoted with the same reference numerals as with the pre-distortion signal generating unit 322 illustrated in FIG. 4.

As illustrated in FIG. 7, the pre-distortion signal generating unit 722 includes a distortion compensation coefficient supplying unit 450, a distortion compensation processing unit 460, and an offset correction processing unit 770. The offset correction processing unit 770 includes an offset control unit 732, compensation value storage units 436 and 440, and offset compensation units 438 and 442. The offset control unit 732 includes a mean value calculating unit 434 in the same way as with the offset control unit 432.

With the offset correction processing unit 770, the offset control unit 732 executes the following offset amount calculation processing, offset amount determination processing, and offset correction processing individually regarding each of the LUTa 406 through LUTd 412.

The offset control unit 732 selects a LUT to be processed out of the LUTa 406 through LUTd 412. The offset control unit 432 reads out the distortion compensation coefficient $h(p_i)$ from all of the addresses $A_i$ where a distortion compensation coefficient to be corrected is stored, within the LUT selected to be processed.

The mean value calculating unit 434 of the offset control unit 732 performs the addition averaging operation indicated with the above Expression 1 regarding all of the read distortion compensation coefficients $h(p_i)$. The offset control unit 732 calculates a mean value using the mean value calculating unit 434, thereby performing the calculation processing of the offset amount LUTofst of the distortion compensation coefficients as to the LUT to be processed.

The offset control unit 732 performs determination processing of the offset amount LUTofst prior to the offset correction value setting processing by determining whether or not the calculated offset amount LUTofst of the distortion compensation coefficients is a value within a predetermined range.

When determining that the calculated offset amount LUTofst is a value within a predetermined range, the offset control unit 732 does not perform the offset correction processing as to the distortion compensation coefficients of the LUT to be processed. On the other hand, when determining that the calculated offset amount LUTofst is a value out of a predetermined range (is not a value within a predetermined range), the offset control unit 732 executes the offset correction processing as to the distortion compensation coefficients of the LUT to be processed.

Accordingly, with the distortion compensation apparatus 702, the offset control unit 732 can be controlled so that when the magnitude (absolute value) of the calculated offset amount is smaller than a certain threshold, and necessity to perform offset correction processing of the distortion compensation coefficient at each LUT is low, the offset correction processing is not performed, and when the magnitude (absolute value) of the calculated offset amount is greater than a certain threshold, and necessity to perform offset correction processing of the distortion compensation coefficient at each LUT is high, the offset correction processing is selectively executed, and accordingly, the offset correction processing can more effectively be performed at the offset control unit 732.

Accordingly, with the distortion compensation apparatus 702, the power consumption of the offset correction processing unit 770 and distortion compensation coefficient supplying unit 450 can be reduced.

2-2. Example of Distortion Compensation Coefficient Correction and Updating Operation at Distortion Compensation Apparatus 702

Figure 8:
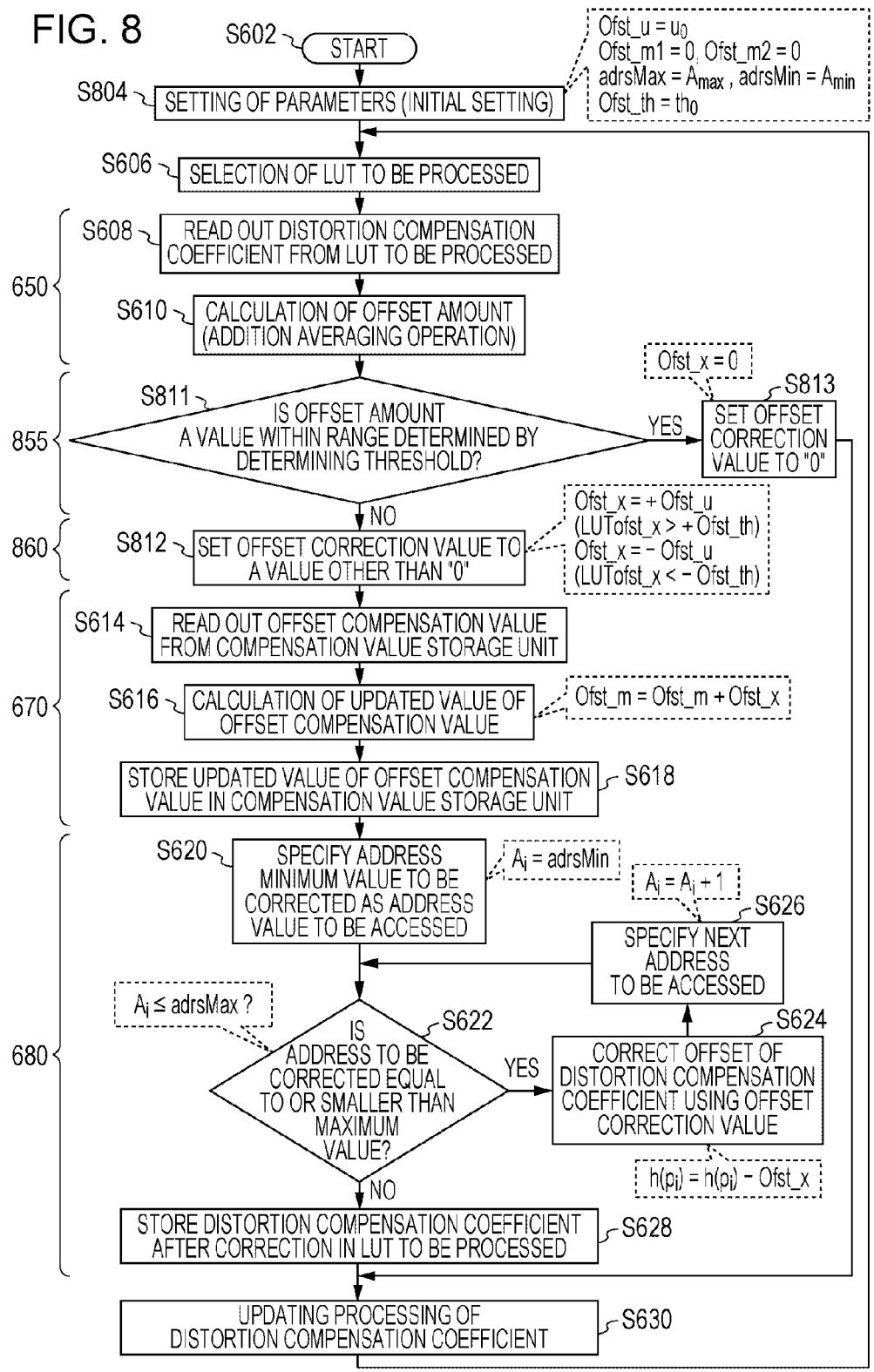
FIG. 8 is a diagram illustrating an example of a flowchart of distortion compensation coefficient correction and updating processing at a distortion compensation apparatus according to the second embodiment.

FIG. 8 is a diagram illustrating an example of a flowchart of distortion compensation coefficient correction and updating processing at the distortion compensation apparatus 702 according to the second embodiment. With the flowchart of the distortion compensation coefficient correction and updating processing illustrated in FIG. 8, the same or corresponding steps are denoted with the same reference numerals as with the steps of the flowchart illustrated in FIG. 6. Hereafter, description will be made regarding the distortion compensation coefficient correction and updating processing that the distortion compensation apparatus 702 executes, with reference to the flowchart in FIG. 8. Note that, with the flowchart in FIG. 8, a numeric expression relating to the processing in the corresponding step is indicated in a portion surrounded with a dotted line.

First, in step S602, the distortion compensation apparatus 702 starts a series of the distortion compensation coefficient correction and updating processing.

Next, in step S804, the offset control unit 732 sets parameters used for later-described offset amount determination processing 855 and offset correction value setting processing 860, offset compensation value updating processing 670, and offset correction processing 680 as initial setting. Examples of the parameters to be set include the offset correction unit Ofst_u to be used for the offset correction value setting processing, the address minimum value adrsMin and maximum value adrsMax within each LUT where a distortion compensation coefficient to be corrected in the offset correction processing is stored, offset compensation values Ofst_m1 and Ofst_m2 to be stored in the compensation value storage units 436 and 440 in the offset compensation value updating processing, and an offset amount determining threshold Ofst_th for determining the range of the offset amount serving as a determination reference in the offset amount determination processing.

Though not particularly restricted, a certain positive value $u_o$ is set as the offset correction unit Ofst_u, and 0 (zero) is set as the offset compensation values Ofst_m1 and Ofst_m2.

$$\text{Ofst\_}u = u_o$$

$$\text{Ofst\_}m1 = 0, \text{Ofst\_}m2 = 0$$

Also, though not particularly restricted, the minimum value $A_{min}$ and maximum value $A_{max}$ of addresses where a correction coefficient is stored in the respective LUT are set as the address minimum value adrsMin and maximum value adrsMax to be corrected, respectively.

$$\text{adrsMin} = A_{min}$$

$$\text{adrsMax} = A_{max}$$

Also, though not particularly restricted, a certain positive value $th_0$ is set as the offset amount determining threshold Ofst_th.

$$\text{Ofst\_}th = th_o$$

Next, according to the steps S606 through S610, an LUT to be processed is selected, and the calculation processing 650 of the offset amount LUTofst_x as to the selected LUTx to be processed is performed (x is any of a through d). The details of the processing performed in steps S606 through S610 is as described in the flowchart in FIG. 6.

Next, in step S811, the offset control unit 732 determines whether or not the calculated offset amount LUTOfst_x is a value within a range determined by the offset determining threshold Ofst_th set in step S804, i.e., whether or not the following Expression 2 is satisfied $$-\text{Ofst\_}th \leq \text{LUTOfst\_}x \leq +\text{Ofst\_}th \quad \text{Expression 2}$$

$$(-th_0 \leq \text{LUTOfst\_}x + th_0)$$

In the event that the offset control unit 732 has determined in step S811 that the calculated offset amount LUTofst_x is a value within the range indicated by the above Expression 2, the processing proceeds to step S813.

In step S813, the offset control unit 732 sets 0 (zero) as the offset correction value Ofst_x as to the LUTx to be processed. After setting the offset correction value, the processing proceeds to step S630.

$$\text{Ofst\_}x = 0$$

Specifically, when determining that the offset amount LUTofst_x is a value within the range indicated by the above Expression 2, the offset control unit 732 performs the distortion compensation coefficient updating processing in step S630 without executing the offset compensation value updating processing 670 nor offset correction processing 680.

On the other hand, in the event that the offset control unit 732 has determined in step S811 that the calculated offset amount LUTofst_x is a value out of the range indicated by the above Expression 2 (is not a value within the range indicated by the above Expression 2), the processing proceeds to step S812.

In step S812, when determining that the offset amount LUTofst_x is a value greater than the upper limit +Ofst_th (=+$th_0$), the offset control unit 732 performs processing for setting a value other than 0 (zero) as the offset correction value Ofst_x as to the LUTx to be processed using the offset correction unit Ofst_u as follows. That is to say, the offset control unit 432 sets a certain positive value $u_0$ as the offset correction value.

$$\text{Ofst\_}x = +\text{Ofst\_}u = +u_0$$

When determining in step S812 that the offset amount LUTofst_x is a value smaller than the lower limit −Ofst_th (=−$th_0$), the offset control unit 732 performs processing for setting a value other than 0 (zero) as the offset correction value Ofst_x as to the LUTx to be processed using the offset correction unit Ofst_u as follows. That is to say, the offset control unit 432 sets a certain negative value −$u_o$ as the offset correction value.

$$\text{Ofst\_}x = -\text{Ofst\_}u = -u_0$$

After setting the offset correction value in step S812, the processing proceeds to step S614.

According to the above steps S811 through S813, the offset amount determination processing 855 and offset correction value setting processing 860 are performed at the offset correction processing unit 770.

Next, according to steps S614 through S628, the offset compensation value updating processing 670 and offset correction processing 680 are performed as to the LUTx to be processed (x is any of a through d). The details of the processing performed in steps S614 through S628 are as described above in the flowchart in FIG. 6.

A series of processing performed by the above steps S604 through S628 and S811 through S813 is the distortion compensation coefficient correction processing that the distortion compensation apparatus 702 executes.

Also, in step S630, the distortion compensation coefficient updating unit 324 performs the distortion compensation coefficient updating processing as to each LUT. The distortion compensation coefficient updating processing is as described in the flowchart in FIG. 6. After the distortion compensation coefficient updating processing, the processing returns to step S606.

As described above, with the distortion compensation coefficient correction and updating processing illustrated in FIG. 8, in the same way as with the distortion compensation coefficient correction and updating processing illustrated in FIG. 6, according to the offset amount calculation processing 650 and offset correction processing 680, a distortion compensation coefficient is clipped to the upper limit or lower limit of the coefficient setting range, whereby the distortion compensation performance can be suppressed from deterioration. Further, according to the offset compensation value updating processing 670, even in the event that the value of the distortion compensation coefficient stored in each LUT is corrected by the offset correction processing 680, suitable distortion compensation processing can be performed using a distortion compensation coefficient generated in a pseudo manner.

Further, with the distortion compensation coefficient correction and updating processing illustrated in FIG. 8, in the same way as with the distortion compensation coefficient correction and updating processing illustrated in FIG. 6, according to the offset correction value setting processing 860, a suitable value according to the calculated offset amount can be set as the offset correction value of a distortion compensation coefficient, and also the value of the offset correction unit Ofst_u is suitably adjusted, whereby the influence of the offset correction processing 680 to be applied to the convergence of a distortion compensation coefficient in the distortion compensation coefficient updating processing can be suppressed small.

In addition, with the distortion compensation coefficient correction and updating processing illustrated in FIG. 8, according to the offset amount determination processing 855, determination is made whether or not the calculated offset amount is a value within a predetermined range, whereby whether to execute the offset correction processing 680 and offset compensation value updating processing 670 can selectively be controlled according to the determination result thereof.

Thus, the offset control unit 732 can be controlled so that when the magnitude (absolute value) of the calculated offset amount is smaller than a certain threshold, and necessity to perform the offset correction processing of the distortion compensation coefficient at each LUT is low, the offset correction processing 680 and offset compensation value updating processing 670 are not executed, and when the magnitude (absolute value) of the calculated offset amount is greater than a certain threshold, and necessity to perform the offset correction processing of the distortion compensation coefficient at each LUT is high, the offset correction processing 680 and offset compensation value updating processing 670 are selectively executed, and accordingly, each process can more effectively be executed not only at the offset control unit 732 but also at the compensation value storage units 436 and 400 and each of the LUTa 406 through LUTd 412.

Accordingly, with the distortion compensation coefficient correction and updating processing illustrated in FIG. 8, the power consumption of the offset correction processing unit 770 and distortion compensation coefficient supplying unit 450 can be reduced, and the power consumption of the distortion compensation apparatus 702 can be reduced.

3. Third Embodiment

Hereafter, description will be made regarding a wireless communication device and a distortion compensation apparatus, according to a third embodiment.

3-1. Configuration Example of Pre-Distortion Signal Generating Unit 922

Though the configuration of a wireless communication device 900 according to the third embodiment differs from the configuration of the wireless communication device 300 illustrated in FIG. 3 in that a distortion compensation apparatus 902 and a pre-distortion signal generating unit 922 are provided instead of the distortion compensation apparatus 302 and pre-distortion signal generating unit 322, portions other than those are the same. Accordingly, with regard to the configuration of the wireless communication apparatus 900, drawing thereof is omitted.

Figure 9:
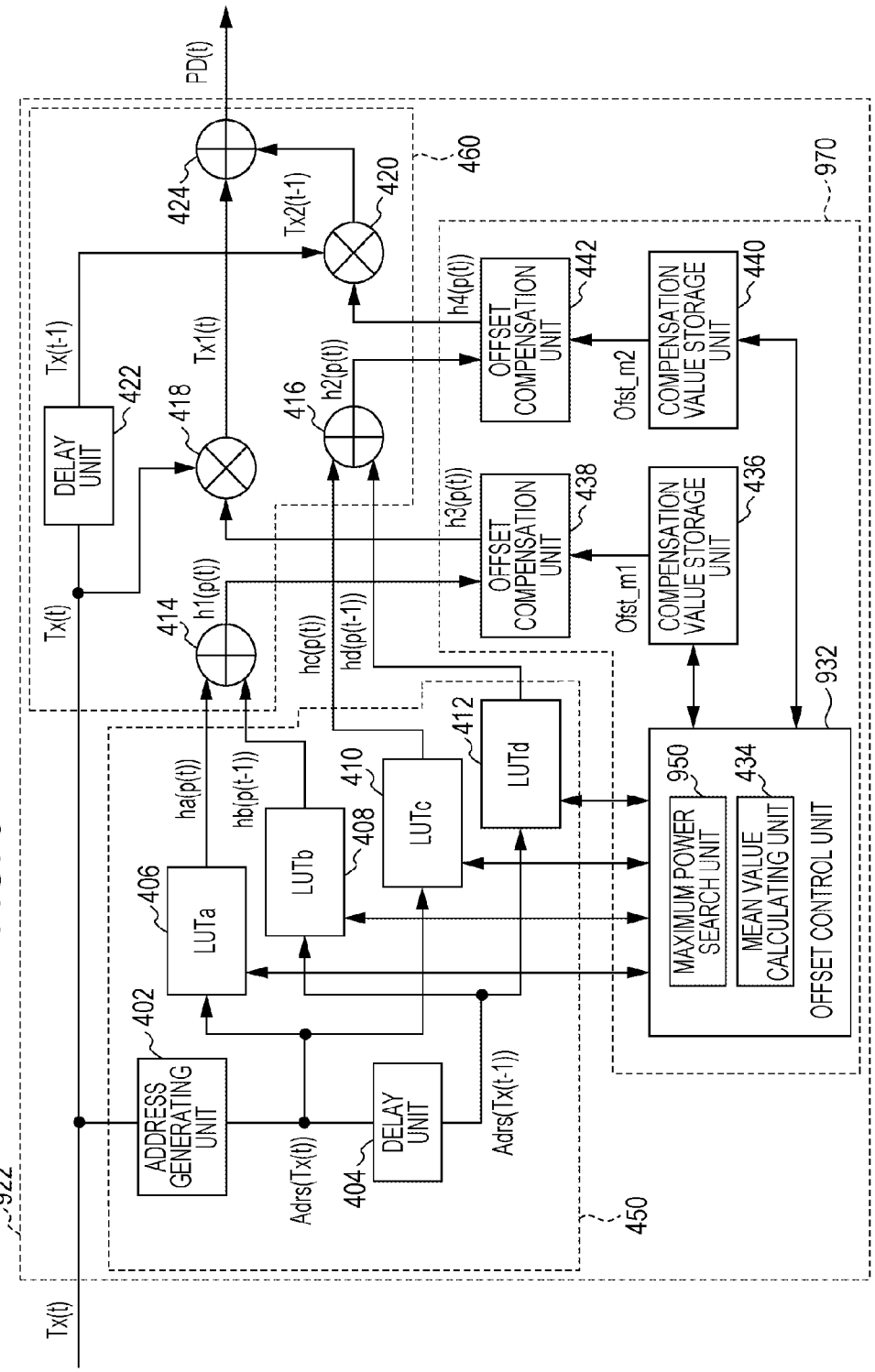
FIG. 9 is a diagram illustrating an example of the internal configuration of a pre-distortion signal generating unit according to a third embodiment.

FIG. 9 is a diagram illustrating an example of the internal configuration of the pre-distortion signal generating unit 922. Though the internal configuration of the pre-distortion signal generating unit 922 differs from the internal configuration of the pre-distortion signal generating unit 322 illustrated in FIG. 4 in that an offset control unit 932 and an offset correction processing unit 970 are provided instead of the offset control unit 432 and offset correction processing unit 470, portions other than those are the same. In FIG. 9, the same or corresponding portions are denoted with the same reference numerals as with the pre-distortion signal generating unit 322 illustrated in FIG. 4.

As illustrated in FIG. 9, the pre-distortion signal generating unit 922 includes a distortion compensation coefficient supplying unit 450, a distortion compensation processing unit 460, and an offset correction processing unit 970. The offset correction processing unit 970 includes an offset control unit 932, compensation value storage units 436 and 440, and offset compensation units 438 and 442. The offset control unit 932 includes a mean value calculating unit 434 in the same way as with the offset control unit 432, and also includes a maximum power search unit 950 configured to search the maximum power of the transmission signal Tx(t).

With the offset correction processing unit 970, the offset control unit 932 executes processing for search the maximum power of the transmission signal Tx(t) after a series of processing, such as the offset amount calculation processing and offset correction processing, are executed.

The maximum power search unit 950 of the offset control unit 932 receives the transmission signal Tx(t), and calculates the power value p(t) of the transmission signal Tx(t) based on the amplitude of the received transmission signal Tx(t). The maximum power search unit 950 monitors the power value p(t) of the transmission signal Tx(t) for a certain period of time, and determines a maximum power value p_spec out of the power value p(t) obtained for the certain period of time thereof.

The maximum power search unit 950 determines whether or not the determined maximum power value p_spec is greater than the current maximum power value p_max corresponding to the current address maximum value adrsMax to be corrected.

When determining that the determined maximum power value p_spec is greater than the current maximum power value p_max corresponding to the current address maximum value adrsMax to be corrected (p_spec>p_max), the maximum power search unit 950 updates the value of the address maximum value adrsMax to be corrected to the address value corresponding to the determined maximum power value p_spec.

On the other hand, when determining that the determined maximum power value p_spec is equal to or smaller than the current maximum power value p_max corresponding to the current address maximum value adrsMax to be corrected (p_spec≤p_max, not greater than the current maximum power value p_max), the maximum power search unit 950 does not update the address maximum value adrsMax to be corrected, and maintains the current value.

The offset control unit 932 executes a series of the processing such as the offset amount calculation processing and offset correction processing and so forth again using the address maximum value adrsMax to be corrected after the maximum power search processing by the maximum power search unit 950.

Here, of all of the compensation coefficient h(p(t)) within each LUT, the distortion compensation coefficient stored in the address corresponding to the power value greater than the maximum power value p_max of the transmission signal Tx(t) is a coefficient that has not ever been used since the transmission signal Tx(t) having the corresponding power value has not been input during the operation of the distortion compensation apparatus 902, and is a coefficient with no updating processing being performed. Therefore, it can be conceived that the offset correction processing does not have to be performed regarding the distortion compensation coefficient stored in the address corresponding to a power value greater than the maximum power value p_max.

On the other hand, with the distortion compensation apparatus 902, the address maximum value adrsMax to be corrected has been determined using the maximum power value p_max of the transmission signal Tx(t) that has been input up to now, and accordingly, the address region to be corrected of each LUT to be accessed in the offset amount calculation processing or offset correction processing can be set based on the maximum power value p_max of the transmission signal Tx(t). Thus, an address where a distortion compensation coefficient that does not have to be subjected to the offset correction processing is stored can be excluded from addresses to be accessed, and accordingly, the operation of the offset amount calculation processing or offset correction processing at the offset control unit 932 can more effectively be performed.

Accordingly, with the distortion compensation apparatus 902, the power consumption of the offset correction processing unit 970 and distortion compensation coefficient supplying unit 450 can be reduced.

Note that, with the above embodiment, the power value of the transmission signal Tx(t) has been monitored for a certain period of time, thereby determining the maximum power value p_spec during the certain period of time thereof, and the address region to be corrected of each LUT to be accessed has been set based on the determined maximum power value p_spec, but further, an arrangement may be made wherein the minimum power value for the certain period of time thereof is determined, and the address region to be corrected of each LUT to be accessed is set based on the determined minimum power value. In this case, according to the offset control unit 932, determination is made whether or not the determined minimum power value is smaller than the current minimum power value p_min corresponding to the current address minimum value adrsMin to be corrected, and in the event that determination is made that the determined minimum power value is smaller than the current minimum power value p_min, the address minimum value adrsMin to be corrected may be updated to the value of an address corresponding to the determined minimum power value.

3-2. Example of Distortion Compensation Coefficient Correction and Updating Operation at Distortion Compensation Apparatus 902

Figure 10:
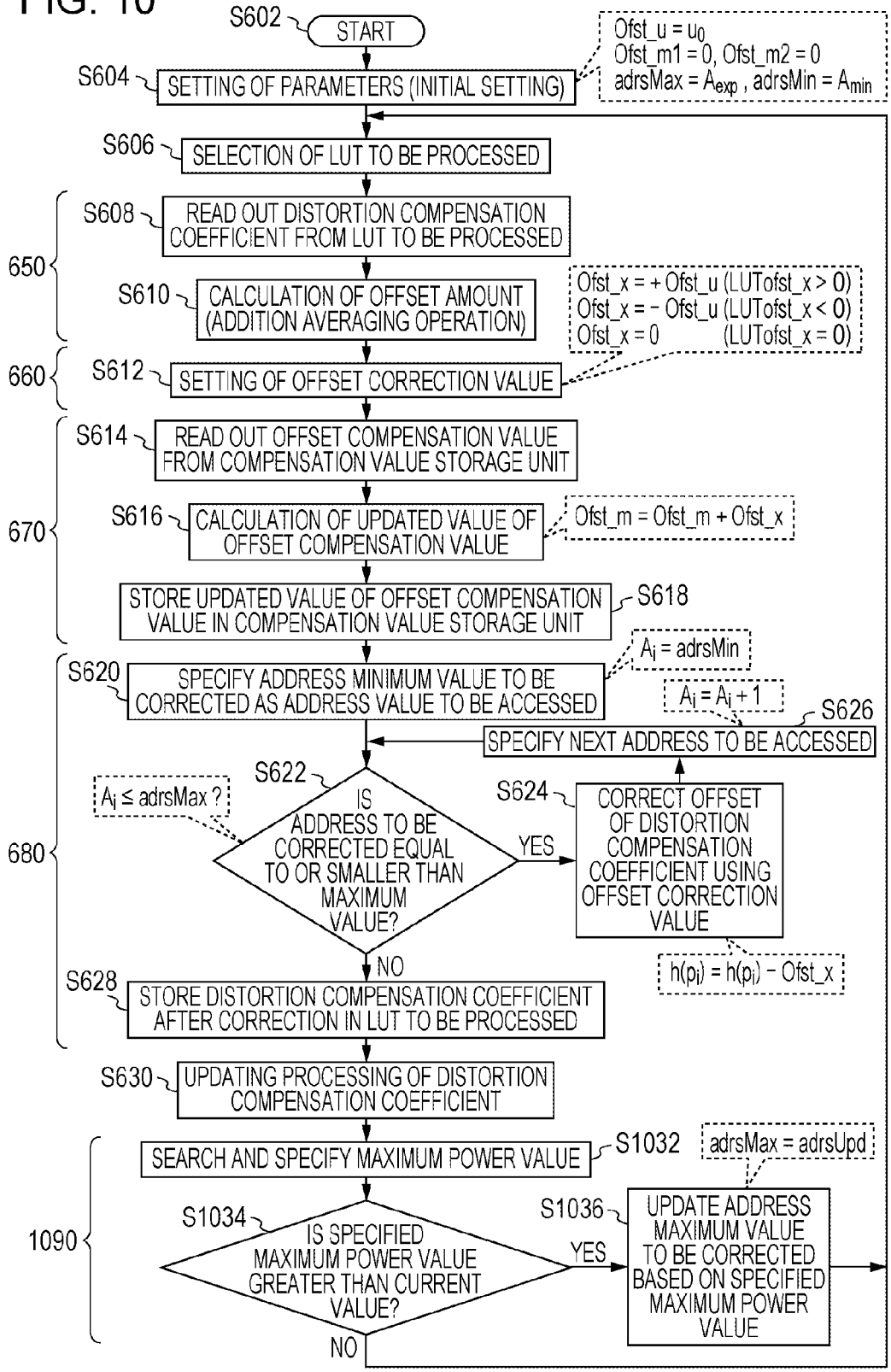
FIG. 10 is a diagram illustrating an example of a flowchart of distortion compensation coefficient correction and updating processing at a distortion compensation apparatus according to the third embodiment.

FIG. 10 is a diagram illustrating an example of a flowchart of distortion compensation coefficient correction and updating processing at the distortion compensation apparatus 902 according to the third embodiment. With the flowchart of the distortion compensation coefficient correction and updating processing illustrated in FIG. 10, the same or corresponding steps are denoted with the same reference numerals as with the steps of the flowchart illustrated in FIG. 6. Hereafter, description will be made regarding the distortion compensation coefficient correction and updating processing that the distortion compensation apparatus 902 executes, with reference to the flowchart in FIG. 10. Note that, with the flowchart in FIG. 10, a numeric expression relating to the processing in the corresponding step is indicated in a portion surrounded with a dotted line.

First, in step S602, the distortion compensation apparatus 902 starts a series of the distortion compensation coefficient correction and updating processing.

Next, in step S604, the offset control unit 932 of the offset correction processing unit 970 sets parameters used for the offset correction value setting processing 660, offset compensation value updating processing 670, and offset correction processing 680 as initial setting. Examples of the parameters to be set include the offset correction unit Ofst_u to be used for the offset correction value setting processing, the address minimum value adrsMin and maximum value adrsMax within each LUT where a distortion compensation coefficient to be corrected in the offset correction processing is stored, and offset compensation values Ofst_m1 and Ofst_m2 to be stored in the compensation value storage units 436 and 440 in the offset compensation value updating processing.

Though not particularly restricted, a certain positive value $u_o$ is set as the offset correction unit Ofst_u, and 0 (zero) is set as the offset compensation values Ofst_m1 and Ofst_m2.

$$Ofst\_u = u_o$$

$$Ofst\_m1=0, Ofst\_m2=0$$

Also, though not particularly restricted, the minimum value $A_{min}$ of an address where a compensation coefficient is stored at each LUT is set as the address minimum value adrsMin to be corrected.

$$adrsMin = A_{min}$$

Also, though not particularly restricted, a predicted value $A_{exp}$ to be predicted as the maximum value of the power value of the transmission signal Tx(t) that the distortion compensation apparatus 902 receives is set as the address maximum value adrsMax to be corrected.

$$adrsMax = A_{exp}$$

Next, according to the steps S606 through S628, an LUT to be processed is selected, and the offset control unit 932 executes the offset amount calculation processing 650, offset correction value setting processing 660, offset compensation value updating processing 670, and offset correction processing 680 as to the selected LUTx to be processed (x is any of a through d).

Next, in step S630, the distortion compensation coefficient updating unit 324 executes the distortion compensation updating processing as to each LUT. The details of the processing performed in steps S606 through S630 is as described in the flowchart in FIG. 6.

Next, in step S1032, the maximum power search unit 950 of the offset control unit 932 receives the transmission signal Tx(t), and calculates the power value p(t) of the transmission signal Tx(t) based on the amplitude of the received transmission signal Tx(t). The maximum power search unit 950 continuously monitors the power value p(t) of the transmission signal Tx(t) for a certain period of time, and determines a maximum power value p_spec by searching the maximum value out of the power value p(t) obtained for the certain period of time thereof.

Next, in step S1034, the maximum power search unit 950 obtains the corresponding current maximum power value p_max based on the currently set address maximum value adrsMax to be corrected. The maximum power search unit 950 determines whether or not the maximum power value p_spec determined in step S1032 is greater than the corresponding current maximum power value p_max.

When determining that the determined maximum power value p_spec is greater than the current maximum power value p_max (p_spec>p_max), the processing proceeds to step S1036.

On the other hand, when determining that the determined maximum power value p_spec is equal to or smaller than the current maximum power value p_max (p_spec≤p_max, not greater than the current maximum power value p_max), the processing returns to step S606. At this time, the maximum power search unit 950 does not update the value of the address maximum value adrsMax to be corrected, and maintains the currently set value as the value of the address maximum value adrsMax to be corrected.

Next, in step S1036, the maximum power search unit 950 generates the corresponding address value adrsUpd based on the maximum power value p_spec determined in step S1032. The maximum power search unit 950 updates the address maximum value adrsMax to be corrected, to the generated address value adrsUpd.

adrsMax=adrsUpd

After the updating processing of the address maximum value adrsMax, the processing returns to step S606.

According to the above steps S1032 through S1036, the maximum power search processing 1090 is performed at the offset correction processing unit 970.

A series of processing performed by the above steps S604 through S628 and S1032 through S1036 is the distortion compensation coefficient correction processing that the distortion compensation apparatus 902 executes.

In step S606 and thereafter, the offset control unit 932 executes the series of the distortion compensation coefficient correction and updating processing again using the updated address maximum value adrsMax to be corrected.

As described above, with the distortion compensation coefficient correction and updating processing illustrated in FIG. 10, in the same way as with the distortion compensation coefficient correction and updating processing illustrated in FIG. 6, a distortion compensation coefficient is clipped to the upper limit or lower limit in the coefficient setting range by the offset amount calculation processing 650 and offset correction processing 680, whereby the distortion compensation performance can be suppressed from deterioration. Further, according to the offset compensation value updating processing 670, even in the event that the value of the distortion compensation coefficient stored in each LUT has been corrected by the offset correction processing 680, suitable distortion compensation processing can be performed using a distortion compensation coefficient generated in a pseudo manner.

Further, with the distortion compensation coefficient correction and updating processing illustrated in FIG. 10, in the same way as with the distortion compensation coefficient correction and updating processing illustrated in FIG. 6, according to the offset correction value setting processing 760, a suitable value according to the calculated offset amount can be set as the offset correction value of a distortion compensation coefficient, and also the value of the offset correction unit Ofst_u is suitably adjusted, whereby the offset correction processing 680 can suppress influence to be applied to the convergence of a distortion compensation coefficient small in the distortion compensation coefficient updating processing.

In addition, with the distortion compensation coefficient correction and updating processing illustrated in FIG. 10, according to the maximum power search processing 1090, the address maximum value adrsMax to be corrected is determined with the maximum power value p_max of the transmission signal Tx(t) that has been input up to now, whereby an address region to be corrected at each LUT to be accessed in the offset amount calculation processing and offset correction processing can be set based on the maximum power value p_max of the transmission signal Tx(t).

Accordingly, an address corresponding to a power value greater than the maximum power value p_max of the transmission signal Tx(t), where a distortion compensate coefficient of which the necessity to perform the offset correction processing is low is stored, can be excluded from addresses to be accessed by the maximum power search processing 1090, and accordingly, each process can more effectively be executed not only at the offset control unit 932 but also at each of the LUTa 406 through LUTd 412.

Accordingly, with the distortion compensation coefficient correction and updating processing illustrated in FIG. 10, the power consumption of the offset correction processing unit 970 and distortion compensation coefficient supplying unit 450 can be reduced, and the power consumption of the distortion compensation apparatus 902 can be reduced.

Note that, with the flowchart in FIG. 10, with regard to processing other than the maximum power search processing 1090, though an example employing the distortion compensation coefficient correction and updating processing according to the first embodiment is illustrated in FIG. 6 has been described, the present disclosure is not restricted to this, and the distortion compensation coefficient correction and updating processing according to the second embodiment illustrated in FIG. 8 may be employed, for example.

4. Fourth Embodiment

Hereafter, description will be made regarding a wireless communication device and a distortion compensation apparatus, according to a fourth embodiment.

4-1. Configuration Example of Pre-Distortion Signal Generating Unit 1122

Though the configuration of a wireless communication device 1110 according to the fourth embodiment differs from the configuration of the wireless communication device 300 illustrated in FIG. 3 in that a distortion compensation apparatus 1102 and a pre-distortion signal generating unit 1122 are provided instead of the distortion compensation apparatus 302 and pre-distortion signal generating unit 322, portions other than those are the same. Accordingly, with regard to the configuration of the wireless communication apparatus 1100, drawing thereof is omitted.

Figure 11:
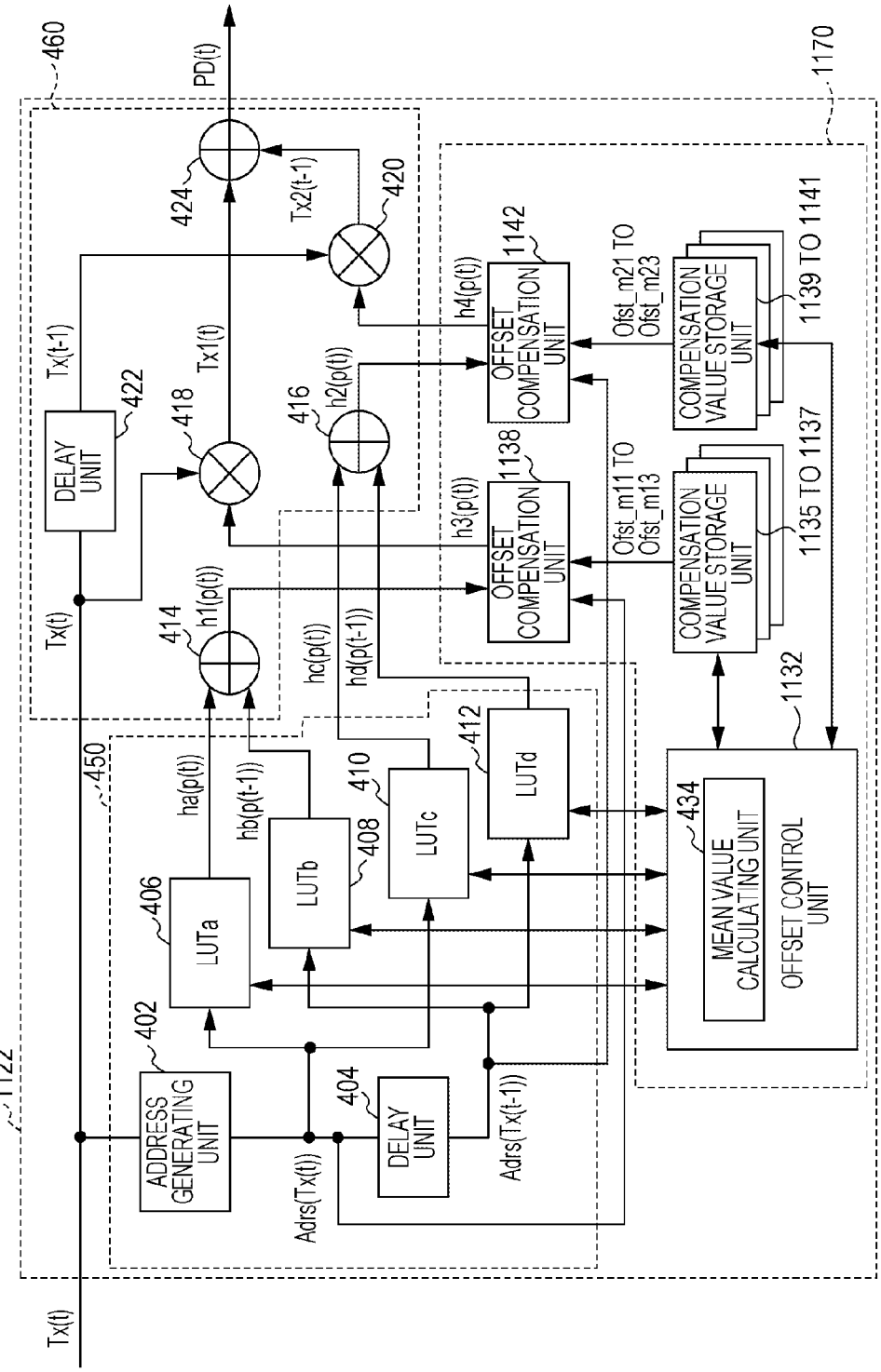
FIG. 11 is a diagram illustrating an example of the internal configuration of a pre-distortion signal generating unit according to a fourth embodiment.
Figure 12:
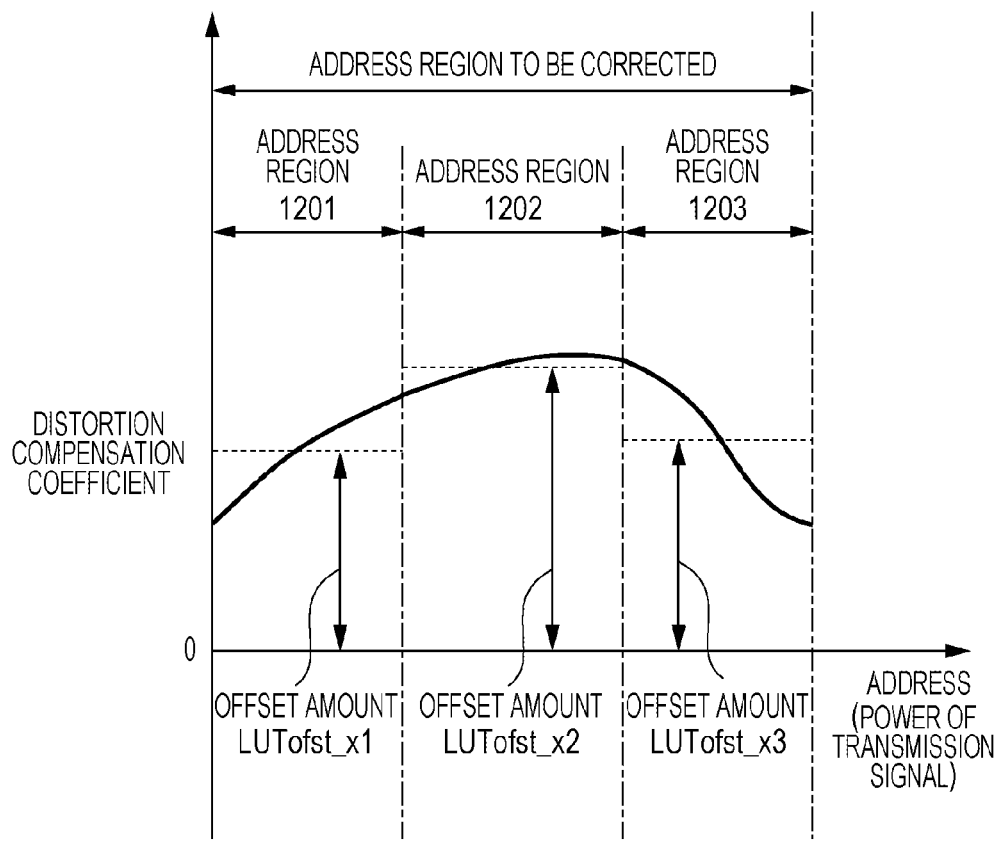
FIG. 12 is a diagram for describing distortion compensation coefficient correction processing at the pre-distortion signal generating unit according to the fourth embodiment.

FIG. 11 is a diagram illustrating an example of the internal configuration of the pre-distortion signal generating unit 1122. FIG. 12 is a diagram for describing the distortion compensation coefficient correction processing at the pre-distortion signal generating unit 1122. Hereafter, a configuration example of the pre-distortion signal generating unit 1122 will be described with reference to FIGS. 11 and 12.

Though the internal configuration of the pre-distortion signal generating unit 1122 differs from the internal configuration of the pre-distortion signal generating unit 322 illustrated in FIG. 4 in that an offset control unit 1132 and an offset correction processing unit 1170 are provided instead of the offset control unit 432 and offset correction processing unit 470, compensation value storage units 1135 through 1137 and 1139 through 1141 are provided instead of the compensation value storage units 436 and 440, and offset compensation units 1138 and 1142 are provide instead of the offset compensation units 438 and 442, portions other than those are the same. In FIG. 11, the same or corresponding portions are denoted with the same reference numerals as with the pre-distortion signal generating unit 322 illustrated in FIG. 4.

As illustrated in FIG. 11, the pre-distortion signal generating unit 1122 includes a distortion compensation coefficient supplying unit 450, a distortion compensation processing unit 460, and an offset correction processing unit 1170. The offset correction processing unit 1170 includes an offset control unit 1132, compensation value storage units 1135 through 1137 and 1139 through 1141, and offset compensation units 1138 and 1142. The offset control unit 1132 includes a mean value calculating unit 434 in the same way as with the offset control unit 432.

In general, the frequency of occurrence of the transmission signal Tx(t) that the distortion compensation apparatus receives has bias regarding the power value p(t) thereof. Specifically, the transmission signal Tx(t) has a tendency wherein, with a range of the power value corresponding to an address region to be corrected, the frequency of occurrence of a transmission signal having a medium-sized power value is high, and the frequency of occurrence of a transmission signal having a small power value and a transmission signal having a great power value is low. With regard to the distortion compensation coefficient h(p(t)) corresponding to a power value p(t) of which the frequency of occurrence is low, a frequency where coefficient updating processing is performed is also low.

Therefore, with regard to a distortion compensation coefficient corresponding to a power value smaller or greater than the above medium-sized power value, the actual offset amount thereof is apt to be generally smaller than the offset amount LUTofst in the case of being calculated as the mean value of the distortion compensation coefficients of the entire address region to be corrected. Conversely, the actual offset amount of the distortion compensation coefficient h(p(t)) corresponding to the above medium-sized power value p(t) is apt to be generally greater than the offset amount LUTofst in the case of being calculated as the mean value of the distortion compensation coefficients of the entire address region to be corrected. In this way, in general, unbalance regarding the offset amount within the address region to be corrected is caused.

On the other hand, the offset correction processing unit 1170 sets multiple divided address regions within the address region to be corrected within each LUT based on the power value p(t) of the transmission signal Tx(t), and executes each process relating to the distortion compensation coefficient correction processing independently for every set multiple address regions.

Specifically, as illustrated in FIG. 12 for example, the offset control unit 1132 sets three divided regions of an address region 1202 having a medium-sized address corresponding to a power value of which the frequency of occurrence is higher, an address region 1201 having a smaller address than the address region 1202 corresponding to a power value of which the frequency of occurrence is lower, and an address region 1203 having a greater address than the address region 1202 corresponding to a power value of which the frequency of occurrence is lower, within in the address region to be corrected of each LUT.

The offset control unit 1132 executes a series of processing including the offset amount calculation processing, offset correction value setting processing, offset compensation value updating processing, and offset correction processing, independently for every three address regions 1201 through 1203 at each LUT.

The offset control unit 1132 calculates, with the offset amount calculation processing, three offset amounts LUTosft_x1 through LUTosft_x3 corresponding to the address regions 1201 through 1203, for each of the LUTs. The offset control unit 1132 performs setting processing of the offset correction values Ofst_x1 through Ofst_x3 independently for every address regions 1201 through 1203 based on the calculated offset amounts LUTosft_x1 through LUTosft_x3, for each of the LUTs. The offset control unit 1132 performs the offset correction processing as to the distortion compensation coefficient stored in each address region independently for every address regions 1201 through 1203 based on the set offset correction values Ofst_x1 through Ofst_x3, for each of the LUTs.

Also, the offset control unit 1132 sets three offset compensation values Ofst_m11, Ofst_m12, and Ofst_m13 corresponding to the address regions 1201, 1202, and 1203 as the offset compensation values to be supplied to the offset compensation unit 1138 in response to the three offset amounts LUTosft_x1 through LUTosft_x3 being calculated. The offset compensation values Ofst_m11 through Ofst_m13 are stored in the three compensation value storage units 1135 through 1137, respectively.

The offset control unit 1132 calculates, with the offset compensation value updating processing, the updated values of the offset compensation values Ofst_m11 through Ofst_m13 independently for every three address regions 1201 through 1203, and stores the calculated updated values of the offset compensation values Ofst_m11 through Ofst_m13 in the compensation value storage units 1135 through 1137.

Similarly, the offset control unit 1132 sets three offset compensation values Ofst_m21, Ofst_m22, and Ofst_m23 corresponding to the address regions 1201, 1202, and 1203 as the offset compensation values to be supplied to the offset compensation unit 1142. The offset compensation values Ofst_m21 through Ofst_m23 are stored in the three compensation value storage units 1139 through 1141, respectively.

The offset control unit 1132 calculates, with the offset compensation value updating processing, the updated values of the offset compensation values Ofst_m21 through Ofst_m23 independently for every three address regions 1201 through 1203, and stores the calculated updated values of the offset compensation values Ofst_m21 through Ofst_m23 in the compensation value storage units 1139 through 1141.

The offset compensation unit 1138 receives the offset compensation values Ofst_m11 through Ofst_m13 from the compensation value storage units 1135 through 1137. Also, the offset compensation unit 1138 receives the address Adrs(Tx(t)) from the address generating unit 402, and determines which of the address regions 1201 through 1203 the value of the received address Adrs(Tx(t)) corresponds to. The offset compensation unit 1138 selects one value out of the received offset compensation values Ofst_m11 through Ofst_m13 according to the determination result thereof. The offset compensation unit 1138 performs the offset compensation processing as to the post-synthesis coefficient $h1(p(t))$ output from the adder 414 using the selected offset compensation value.

Similarly, the offset compensation unit 1142 receives the offset compensation values Ofst_m21 through Ofst_m23 from the compensation value storage units 1139 through 1141. Also, the offset compensation unit 1142 receives the address Adrs(Tx(t−1) corresponding to the previous reference point-in-time t−1 from the delay unit 404, and determines which of the address regions 1201 through 1203 the received address Adrs(Tx(t−1)) corresponds to. The offset compensation unit 1142 selects one value out of the received offset compensation values Ofst_m21 through Ofst_m23 according to the determination result thereof. The offset compensation unit 1142 performs the offset compensation processing as to the post-synthesis coefficient h2(p(t)) output from the adder 416 using the selected offset compensation value.

Thus, with the distortion compensation apparatus 1102, multiple address regions are set within the address region to be corrected as to each LUT, and multiple offset amounts corresponding to the set multiple address regions are calculated, and accordingly, even in the event that the frequency of occurrence of the transmission signal Tx(t) has bias regarding the power value p(t), a more accurate offset amount corresponding to the power value (address value) thereof can be calculated as to the distortion compensation coefficient within each LUT. Thus, unbalance regarding the offset amount caused within the address to be corrected within each LUT can be reduced, whereby the offset correction processing of the distortion compensation coefficient within each LUT can more precisely be controlled.

Accordingly, with the distortion compensation apparatus 1102, the precision of the offset correction processing of the distortion compensation coefficient within each LUT can be improved.

Note that, with the above embodiment, though an arrangement has been made wherein the three compensation value storage units 1135 through 1137 are provided in response to the three address regions 1201 through 1203, the present disclosure is not restricted to this, and an arrangement may be made for example wherein three storage regions corresponding to the address regions 1201 through 1203 are provided within one offset compensation storage unit, and the offset compensation values Ofst_m11 through Ofst_m13 are stored in these three storage regions. This can also be applied to the compensation value storage units 1139 through 1141.

Also, the number of address regions to be set to the address region to be corrected is not restricted to three, and the number of address regions can be changed as appropriate.

4-2. Example of Distortion Compensation Coefficient Correction and Updating Operation at Distortion Compensation Apparatus 1102

Figure 13:
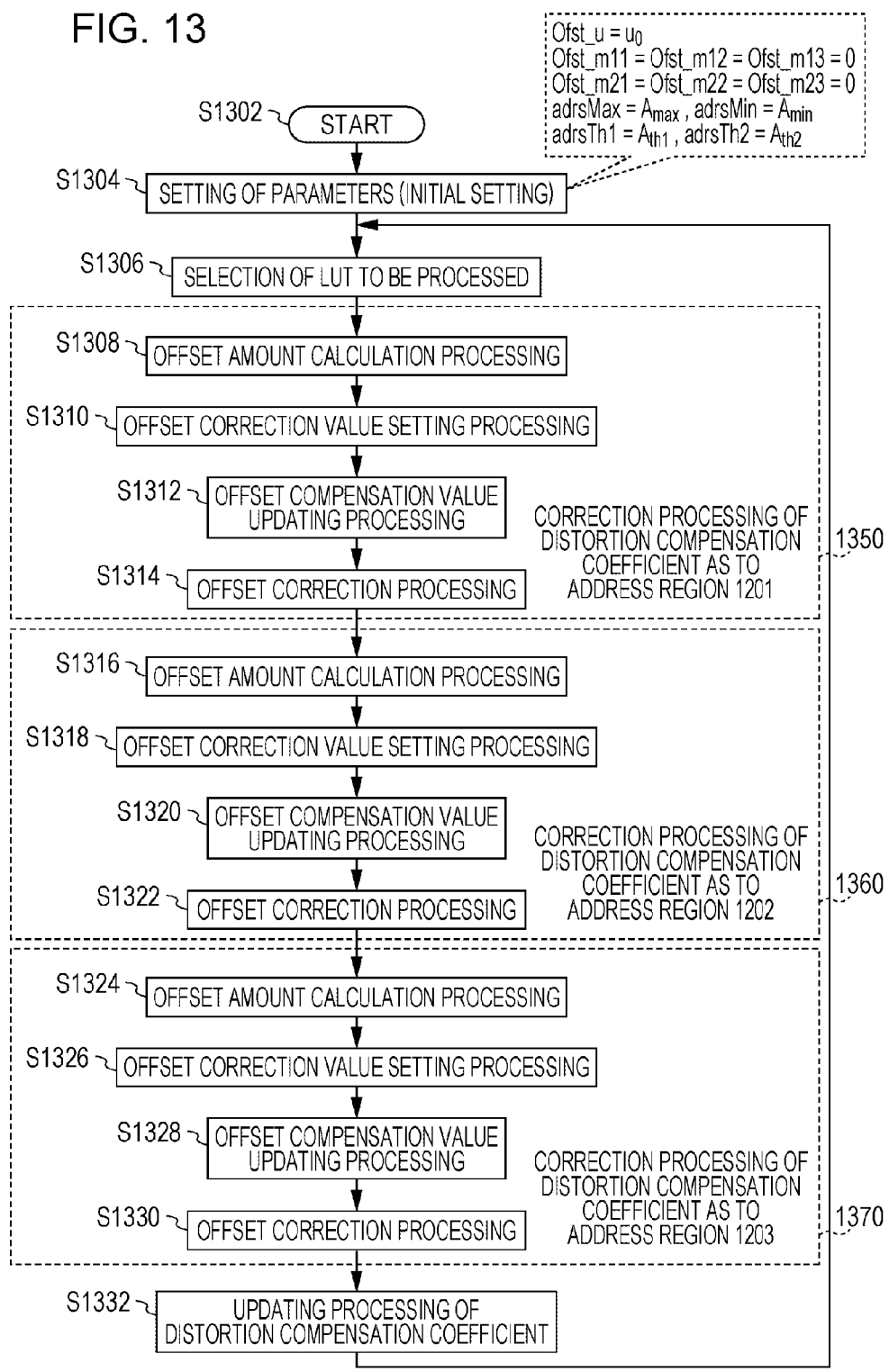
FIG. 13 is a diagram illustrating an example of a flowchart of distortion compensation coefficient correction and updating processing at a distortion compensation apparatus according to the fourth embodiment.

FIG. 13 is a diagram illustrating an example of a flowchart of distortion compensation coefficient correction and updating processing at the distortion compensation apparatus 1102 according to the fourth embodiment. Hereafter, description will be made regarding the distortion compensation coefficient correction and updating processing that the distortion compensation apparatus 1102 executes, with reference to the flowchart in FIG. 13. Note that, with the flowchart in FIG. 13, a numeric expression relating to the processing in the corresponding step is indicated in a portion surrounded with a dotted line.

First, in step S1302, the distortion compensation apparatus 1102 starts a series of the distortion compensation coefficient correction and updating processing.

Next, in step S1304, the offset control unit 1132 of the offset correction processing unit 1170 sets parameters used for offset correction value setting processing, offset compensation value updating processing, and offset correction processing in later-described steps S1308 through S1330 as initial setting.

Examples of the parameters to be set include the offset correction unit Ofst_u to be used for the offset correction value setting processing, the address minimum value adrsMin and maximum value adrsMax within each LUT where a distortion compensation coefficient to be corrected in the offset correction processing is stored, a boundary address value ardsTh1 specifying the value of an address serving as the boundary between the address region 1201 and the address region 1202, a boundary address value ardsTh2 specifying the value of an address serving as the boundary between the address region 1202 and the address region 1203, and the offset compensation values Ofst_m11 through Ofst_m13 and Ofst_m21 through Ofst_m23 to be stored in the compensation value storage units 1135 through 1137 and 1139 through 1141 in the offset compensation value updating processing.

Though not particularly restricted, a certain positive value $u_o$ is set as the offset correction unit Ofst_u.

$$Ofst\_u = u_o$$

Also, 0 (zero) is set as each of the offset compensation values Ofst_m11 through Ofst_m13 and Ofst_m21 through Ofst_m23.

$$Ofst\_m11=0, Ofst\_m12=0$$

$$Ofst\_m13=0$$

$$Ofst\_m21=0, Ofst\_m22=0$$

$$Ofst\_m23=0$$

Also, though not particularly restricted, the minimum value $A_{min}$ and maximum value $A_{max}$ of addresses where a correction coefficient is stored in the respective LUT are set as the address minimum value adrsMin and maximum value adrsMax to be corrected, respectively.

$$adrsMin = A_{min}$$

$$adrsMax = A_{max}$$

Also, though not particularly restricted, predetermined certain address values $A_{th1}$ and $A_{th2}$ are set as the boundary address values adrsTh1 and adrsTh2, respectively.

$$adrsTh1 = A_{th1}$$

$$adrsTh2 = A_{th2}$$

Next, in step S1306, the offset control unit 1132 selects one LUT to be processed out of the LUTa 406 through LUTd 412. The offset control unit 1132 cyclically selects the corresponding LUT in the sequence of LUTa 406, LUTb 408, LUTc 410, LUTd 412, LUTa 406, LUTb 408, and so on, for example.

Next, in step S1308, the offset control unit 1132 performs processing for calculating the offset amount LUTofst_x1 of a distortion compensation coefficient as to the address region 1201 of the LUT_x to be processed (x is any of a through d) selected in step S1306. This offset amount calculation processing is the same as the offset amount calculation processing 650 described in the flowchart in FIG. 6 except that the distortion compensation coefficient h(p(t)) to be subjected to the addition averaging operation indicated by the above Expression 1 are coefficients stored in the address region from the address minimum value adrsMin to the boundary address value adrsTh1.

Next, in step S1310, the offset control unit 1132 performs processing for setting the offset correction value Ofst_x1 as to the address region 1201 of the LUT_x to be processed. This offset correction value setting processing is the same as the offset correction value setting processing 660 described with the flowchart in FIG. 6.

Next, in step S1312, the offset control unit 1132 performs processing for updating the offset compensation values Ofst_m11 and Ofst_m21 corresponding to the address regions 1201 in the respective LUT. This offset compensation value updating processing is the same as the offset compensation value updating processing 670 described with the flowchart in FIG. 6.

Now, in the event that the LUT to be processed selected in step S1306 is the LUTa or LUTb, the offset control unit 1132 stores the updated value Ofst_m of the offset compensation value in the compensation value storage unit 1135, and updates the offset compensation value Ofst_m11 within the compensation value storage unit 1135.

Also, in the event that the LUT to be processed selected in step S1306 is the LUTc or LUTd, the offset control unit 1132 stores the updated value Ofst_m of the offset compensation value in the compensation value storage unit 1139, and updates the offset compensation value Ofst_m21 within the compensation value storage unit 1139.

Next, in step S1314, the offset control unit 1132 performs the offset correction processing as to the distortion compensation coefficient h(p(t)) stored in the address region 1201 of the LUTx to be processed. This offset correction processing is the same as the offset correction processing 680 described with the flowchart in FIG. 6 except that the distortion compensation coefficient h(p(t)) to be subjected to the correction processing are coefficients stored in the address region from the address minimum value adrsMin to the boundary address value adrsTh1.

According to the above steps S1308 through S1314, the distortion compensation coefficient correction processing 1350 as to the address region 1201 is performed at the offset correction processing unit 1170.

Next, in step S1316, the offset control unit 1132 performs processing for calculating the offset amount LUTofst_x2 of a distortion compensation coefficient as to the address region 1202 of the LUT_x to be processed (x is any of a through d) selected in step S1306. This offset amount calculation processing is the same as the offset amount calculation processing 650 described in the flowchart in FIG. 6 except that the distortion compensation coefficient h(p(t)) to be subjected to the addition averaging operation indicated by the above Expression 1 are coefficients stored in the address region from the boundary address value adrsTh1 to the boundary address value adrsTh2.

Next, in step S1318, the offset control unit 1132 performs processing for setting the offset correction value Ofst_x2 as to the address region 1202 of the LUT_x to be processed. This offset correction value setting processing is the same as the offset correction value setting processing 660 described with the flowchart in FIG. 6.

Next, in step S1320, the offset control unit 1132 performs processing for updating the offset compensation values Ofst_m13 and Ofst_m22 corresponding to the address regions 1202 in the respective LUT. This offset compensation value updating processing is the same as the offset compensation value updating processing 670 described with the flowchart in FIG. 6.

Now, in the event that the LUT to be processed selected in step S1306 is the LUTa or LUTb, the offset control unit 1132 stores the updated value Ofst_m of the offset compensation value in the compensation value storage unit 1136, and updates the offset compensation value Ofst_m12 within the compensation value storage unit 1136.

Also, in the event that the LUT to be processed selected in step S1306 is the LUTc or LUTd, the offset control unit 1132 stores the updated value Ofst_m of the offset compensation value in the compensation value storage unit 1140, and updates the offset compensation value Ofst_m22 within the compensation value storage unit 1140.

Next, in step S1322, the offset control unit 1132 performs the offset correction processing as to the distortion compensation coefficient h(p(t)) stored in the address region 1202 of the LUT_x to be processed. This offset correction processing is the same as the offset correction processing 680 described with the flowchart in FIG. 6 except that the distortion compensation coefficient h(p(t)) to be subjected to the correction processing are coefficients stored in the address region from the boundary address value adrsTh1 to the boundary address value adrsTh2.

According to the above steps S1316 through S1322, the distortion compensation coefficient correction processing 1360 as to the address region 1202 is performed at the offset correction processing unit 1170.

Next, in step S1324, the offset control unit 1132 performs processing for calculating the offset amount LUTofst_x3 of a distortion compensation coefficient as to the address region 1203 of the LUT_x to be processed (x is any of a through d) selected in step S1306. This offset amount calculation processing is the same as the offset amount calculation processing 650 described in the flowchart in FIG. 6 except that the distortion compensation coefficient h(p(t)) to be subjected to the addition averaging operation indicated by the above Expression 1 are coefficients stored in the address region from the boundary address adrsTh2 to the address maximum value adrsMax.

Next, in step S1326, the offset control unit 1132 performs processing for setting the offset correction value Ofst_x3 as to the address region 1203 of the LUT_x to be processed. This offset correction value setting processing is the same as the offset correction value setting processing 660 described with the flowchart in FIG. 6.

Next, in step S1328, the offset control unit 1132 performs processing for updating the offset compensation values Ofst_m13 and Ofst_m23 corresponding to the address regions 1203 in the respective LUT. This offset compensation value updating processing is the same as the offset compensation value updating processing 670 described with the flowchart in FIG. 6.

Now, in the event that the LUT to be processed selected in step S1306 is the LUTa or LUTb, the offset control unit 1132 stores the updated value Ofst_m of the offset compensation value in the compensation value storage unit 1137, and updates the offset compensation value Ofst_m13 within the compensation value storage unit 1137.

Also, in the event that the LUT to be processed selected in step S1306 is the LUTc or LUTd, the offset control unit 1132 stores the updated value Ofst_m of the offset compensation value in the compensation value storage unit 1141, and updates the offset compensation value Ofst_m23 within the compensation value storage unit 1141.

Next, in step S1330, the offset control unit 1132 performs the offset correction processing as to the distortion compensation coefficient h(p(t)) stored in the address region 1203 of the LUT_x to be processed. This offset correction processing is the same as the offset correction processing 680 described with the flowchart in FIG. 6 except that the distortion compensation coefficient h(p(t)) to be subjected to the correction processing are coefficients stored in the address region from the boundary address value adrsTh2 to the address maximum value adrsMax.

According to the above steps S1324 through S1330, the distortion compensation coefficient correction processing 1370 as to the address region 1203 is performed at the offset correction processing unit 1170.

A series of processing performed by the above steps S1304 through S1330 is the distortion compensation coefficient correction processing that the distortion compensation apparatus 1102 executes.

Next, in step S1332, the compensation coefficient updating unit 324 performs distortion compensation coefficient updating processing as to the respective LUT. The details of this distortion compensation coefficient updating processing are as described with the flowchart in FIG. 6. After the distortion compensation coefficient updating processing, the processing returns to step S1306.

In step S1306, the offset control unit 1132 selects another LUT out of the LUTa 406 through LUTd 412 as the next LUT to be corrected. The offset control unit 1132 executes the distortion compensation coefficient correction processing 1350 through 1370 as to the address regions 1201 through 1203 regarding the selected LUT to be corrected.

As described above, with the distortion compensation coefficient correction and updating processing illustrated in FIG. 13, in the same way as with the distortion compensation coefficient correction and updating processing illustrated in FIG. 6, according to the offset amount calculation processing and offset correction processing, a distortion compensation coefficient is clipped to the upper limit or lower limit in the coefficient setting range, whereby the distortion compensation performance can be suppressed from deterioration. Further, according to the offset compensation value updating processing 670, even in the event that the value of the distortion compensation coefficient within each LUT has been corrected by the offset correction processing 680, suitable distortion compensation processing can be performed using the distortion compensation coefficient generated in a pseudo manner.

Further, with the distortion compensation coefficient correction and updating processing illustrated in FIG. 13, in the same way as with the distortion compensation coefficient correction and updating processing illustrated in FIG. 6, according to the offset correction value setting processing, a suitable value according to the calculated offset amount can be set as the offset correction value of a distortion compensation coefficient, and also the value of the offset correction unit Ofst_u is suitably adjusted, whereby the offset correction processing can suppress influence to be applied to the convergence of a distortion compensation coefficient in the distortion compensation coefficient updating processing small.

In addition, with the distortion compensation coefficient correction and updating processing illustrated in FIG. 13, the multiple divided address regions 1201 through 1203 are set within the address region to be corrected, and the distortion compensation coefficient correction processes 1350 through 1370 are individually executed as to the address regions 1201 through 1203, whereby the offset amounts LUTofst_x1 through LUTofst_x3 corresponding to the address regions 1201 through 1203 can be calculated.

Accordingly, even in the event that the frequency of occurrence of the transmission signal Tx(t) has bias regarding the power value p(t), a more accurate offset amount according to the power value (address value) thereof can be calculated as to the distortion compensation coefficient within each LUT. Thus, unbalance regarding an offset amount caused within the address regions to be corrected of the respective LUT can be reduced, whereby the distortion compensation coefficient offset correction processing within the respective LUT can more accurately be controlled.

Accordingly, with the distortion compensation coefficient correction and updating processing illustrated in FIG. 13, the precision of the distortion compensation coefficient offset correction processing within the respective LUT can be improved.

Note that, with the flowchart in FIG. 13, though an example employing the distortion compensation coefficient correction processing according to the first embodiment illustrated in FIG. 6 has been illustrated regarding the distortion compensation coefficient correction processes 1350 through 1370, the present disclosure is not restricted to this, and for example, the distortion compensation coefficient correction processing according to the second embodiment illustrated in FIG. 8, or distortion compensation coefficient correction processing according to the third embodiment illustrated in FIG. 10 may be employed, for example.

5. Fifth Embodiment

Hereafter, description will be made regarding a wireless communication device and a distortion compensation apparatus, according to a fifth embodiment.

5-1. Configuration Example of Pre-Distortion Signal Generating Unit 1422

Though the configuration of a wireless communication device 1400 according to the fifth embodiment differs from the configuration of the wireless communication device 300 illustrated in FIG. 3 in that a distortion compensation apparatus 1402 and a pre-distortion signal generating unit 1422 are provided instead of the distortion compensation apparatus 302 and pre-distortion signal generating unit 322, portions other than those are the same. Accordingly, with regard to the configuration of the wireless communication apparatus 1400, drawing thereof is omitted.

Figure 14:
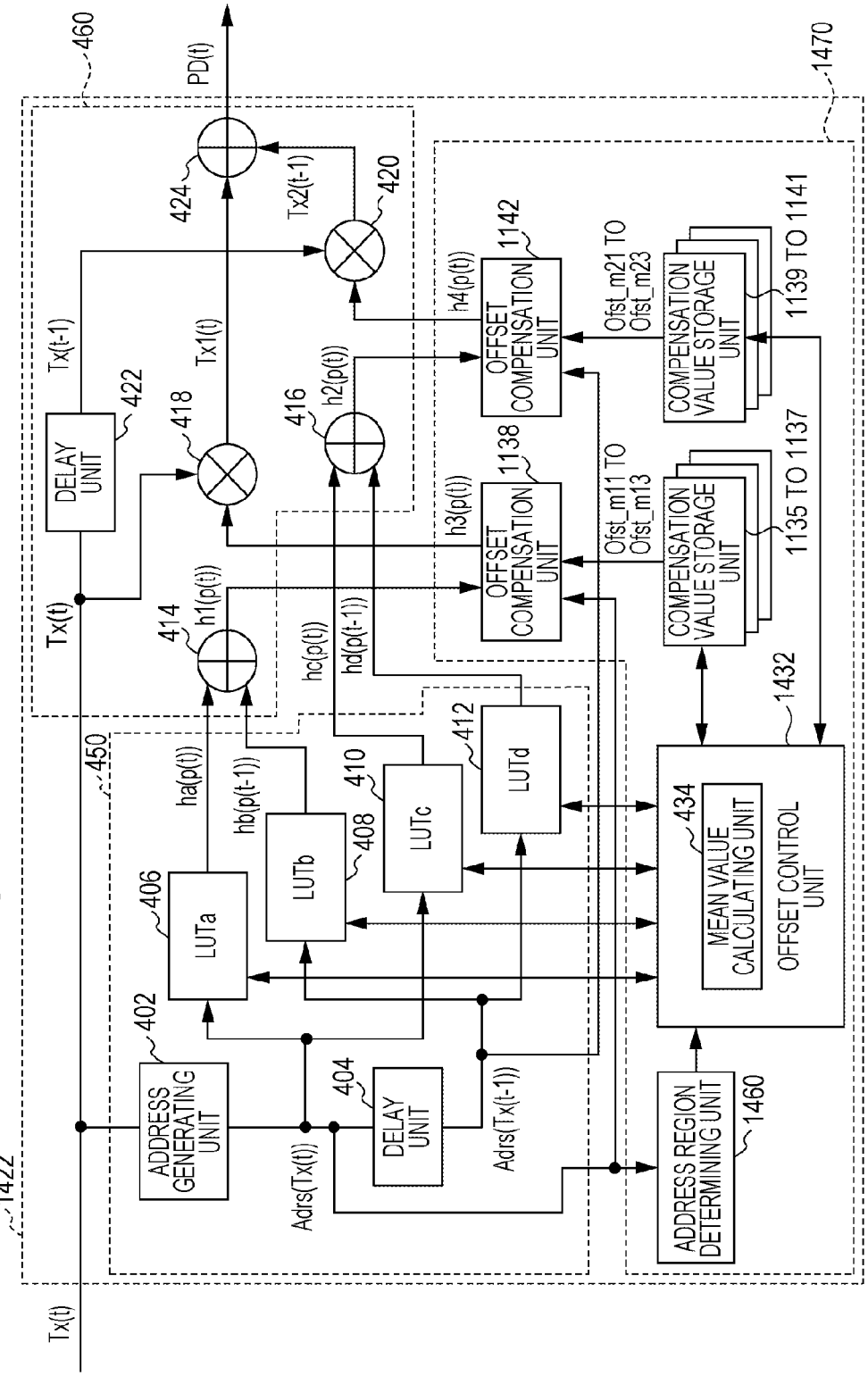
FIG. 14 is a diagram illustrating an example of the internal configuration of a pre-distortion signal generating unit according to a fifth embodiment.
Figure 15:
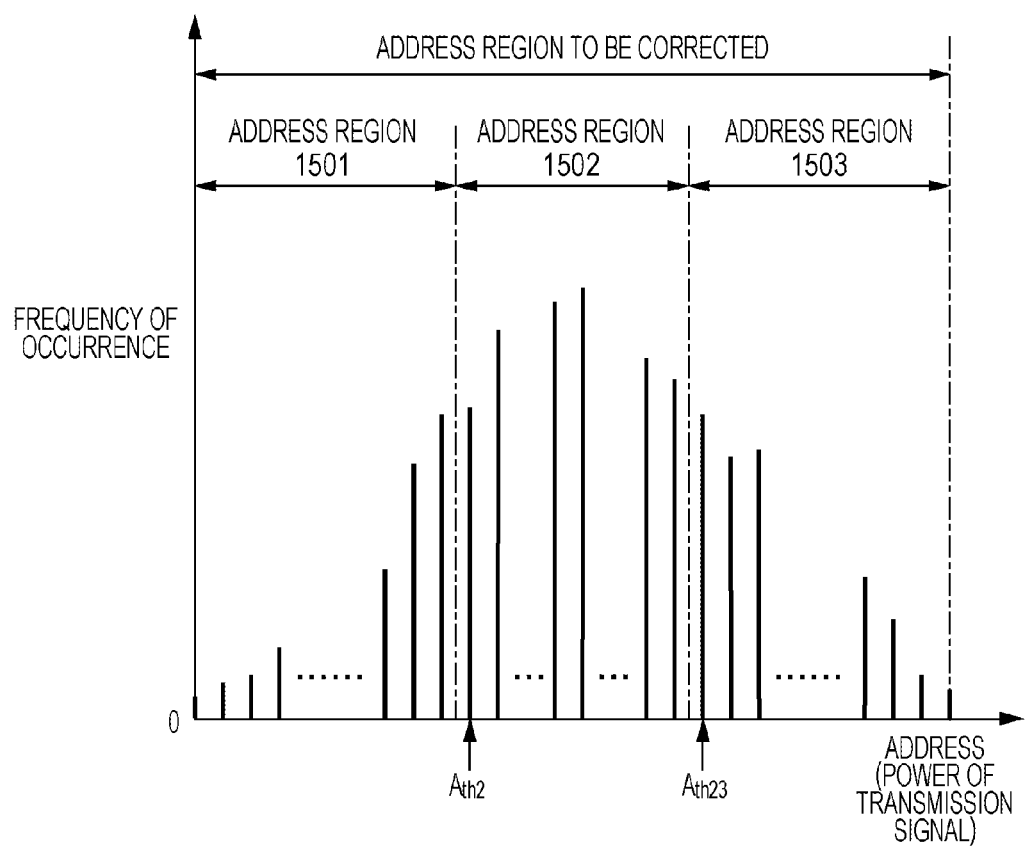
FIG. 15 is a diagram for describing division processing of an address region to be corrected at each LUT in the pre-distortion signal generating unit according to the fifth embodiment.

FIG. 14 is a diagram illustrating an example of the internal configuration of the pre-distortion signal generating unit 1422. FIG. 15 is a diagram for describing the distortion compensation coefficient correction processing at the pre-distortion signal generating unit 1422. Hereafter, a configuration example of the pre-distortion signal generating unit 1422 will be described with reference to FIGS. 14 and 16.

Though the internal configuration of the pre-distortion signal generating unit 1422 differs from the internal configuration of the pre-distortion signal generating unit 1122 illustrated in FIG. 11 in that an offset control unit 1432 and an offset correction processing unit 1470 are provided instead of the offset control unit 1132 and offset correction processing unit 1170, and further, an address region determining unit 1460 is provided, portions other than those are the same. In FIG. 14, the same or corresponding portions are denoted with the same reference numerals as with the pre-distortion signal generating unit 1122 illustrated in FIG. 11.

As illustrated in FIG. 14, the pre-distortion signal generating unit 1422 includes a distortion compensation coefficient supplying unit 450, a distortion compensation processing unit 460, and an offset correction processing unit 1470. The offset correction processing unit 1470 includes an offset control unit 1432, compensation value storage units 1135 through 1137 and 1139 through 1141, offset compensation units 1138 and 1142, and an address region determining unit 1460. The offset control unit 1432 includes a mean value calculating unit 434 in the same way as with the offset control unit 1132.

With the offset correction processing unit 1470, the address region determining unit 1460 receives the generated address Adrs(Tx(t)) from the address generating unit 402 based on the power value p(t) of the transmission signal Tx(t). The address Adrs(Tx(t)) is signals having an address value corresponding to the power value p(t) of the transmission signal Tx(t). The address region determining unit 1460 monitors the received address Adrs(Tx(t)) for a certain period of time (or a certain times of counts worth) to count the frequency of occurrence for every address value. The address region determining unit 1460 calculates, as illustrated in FIG. 15, an occurrence frequency distribution of the address value corresponding to the address Adrs(Tx(t)) based on the result of the counted occurrence frequency.

The address region determining unit 1460 divides the address region to be corrected of each LUT into multiple address regions based on the calculated address value occurrence frequencies. The address region determining unit 1460 performs processing for dividing the address region to be corrected into a predetermined number of regions so that the totals of address value occurrence frequencies in the multiple address regions after division are mutually equal, thereby determining the region made up of the individually divided address regions. The address region determining unit 1460 divides the address region to be corrected of each LUT into three address regions 1501 through 1503 as illustrated in FIG. 15.

The address region determining unit 1460 obtains the value of an address serving as a boundary of the multiple divided address regions, and sets the obtained address value as a boundary address value adrsTHn (n is an integer equal to or greater than 1). For example, as illustrated in FIG. 15, the address region determining unit 1460 obtains the value $A_{th12}$ of an address serving as a boundary between an address region 1501 and an address region 1502 (the minimum value of addresses within the address region 1502), and sets the obtained $A_{th12}$ as a boundary address value adrsTh1. Also, the address region determining unit 1460 obtains the value $A_{th23}$ of an address serving as a boundary between the address region 1502 and an address region 1503 (the minimum value of addresses within the address region 1503), and sets the obtained $A_{th23}$ as a boundary address value adrsTh2. The address region determining unit 1460 outputs address region information ADR including the set boundary address value adrsThn to the offset control unit 1432.

The offset control unit 1432 receives the address region information ADR from the address region determining unit 1460, and sets multiple divided address regions within the address region to be corrected of each LUT based on the received address region information ADR. The offset control unit 1432 sets the boundary address value adrsTHn included in the address region information ADR as a parameter used for processing such as the offset correction processing or the like, thereby setting the multiple address regions.

The offset control unit 1432 sets the three address regions 1501 through 1503 illustrated in FIG. 15 using the above boundary address value ardsTh1 and boundary address value adrsTh2, for example.

Accordingly, the distortion compensation apparatus 1402 determines the range of each of the address regions within the address region to be corrected based on the address value occurrence frequency distribution obtained by monitoring the address Adrs(Tx(t)) generated based on the power value p(t) of the transmission signal Tx(t), whereby a division mode of address regions of the address region to be corrected can be changed according to difference in a communication environment where the distortion compensation 1402, and the wireless communication device including the distortion compensation apparatus 1402 are disposed, and the ranges of the address regions can be optimized. Thus, the distortion compensation coefficient offset correction processing within each LUT can more accurately be controlled as compared to the distortion compensation apparatus 1102.

Accordingly, with the distortion compensation apparatus 1402, the precision of the distortion compensation coefficient offset correction processing within each LUT can further be improved as compared to the distortion compensation apparatus 1102.

Note that, with the above embodiment, though the address region determining unit 1460 calculates an address value occurrence frequency distribution based on the address Adrs (Tx(t)) received from the address generating unit 402, the present disclosure is not restricted to this. For example, an arrangement may be made wherein the address region determining unit 1460 receives the address Adrs(T(t−1)) from the delay unit 404, and calculates an address value occurrence frequency distribution based on the received Adrs(T(t−1)).

Also, with the above embodiment, though an example has been described wherein the address region to be corrected is divided into three address regions, the present disclosure is not restricted to this, and the number of address regions to be divided can be changed as appropriate.

5-2. Example of Distortion Compensation Coefficient Correction and Updating Operation at Distortion Compensation Apparatus 1402

Figure 16:
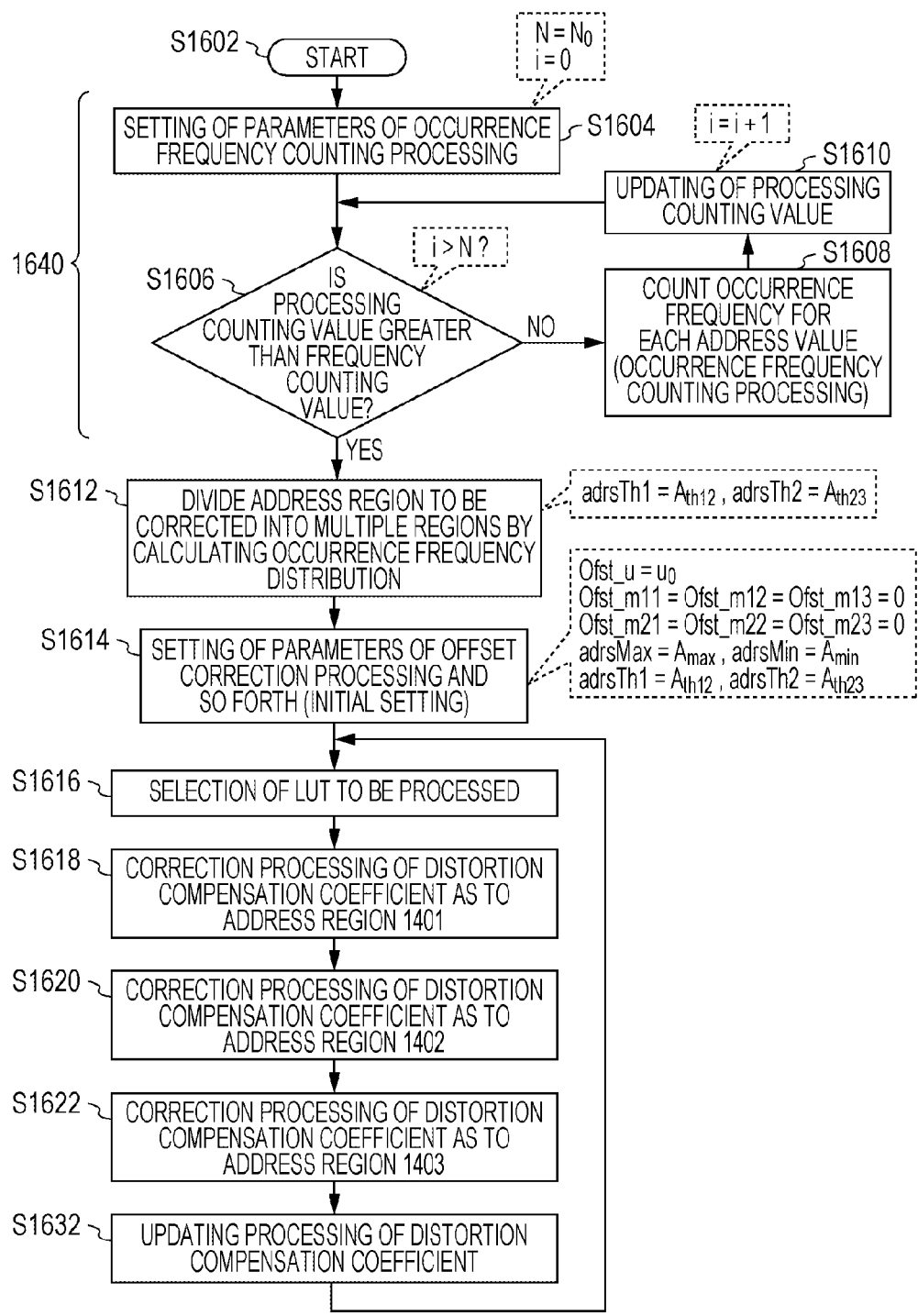
FIG. 16 is a diagram illustrating an example of a flowchart of distortion compensation coefficient correction and updating processing at a distortion compensation apparatus according to the fifth embodiment.

FIG. 16 is a diagram illustrating an example of a flowchart of distortion compensation coefficient correction and updating processing at the distortion compensation apparatus 1402 according to the fifth embodiment. Hereafter, description will be made regarding the distortion compensation coefficient correction and updating processing that the distortion compensation apparatus 1402 executes, with reference to the flowchart in FIG. 16. Note that, with the flowchart in FIG. 16, a numeric expression relating to the processing in the corresponding step is indicated in a portion surrounded with a dotted line.

First, in step S1602, the distortion compensation apparatus 1402 starts a series of the distortion compensation coefficient correction and updating processing.

Next, in step S1604, the address region determining unit 1460 sets parameters used for occurrence frequency counting processing as initial setting. Examples of the parameters to be set include a number of times N (number of times of frequency counting) of processing for counting the frequency of occurrence for every address value based on the address Adrs (Tx(t)) (occurrence frequency counting processing). Now, let us say that this number of times of frequency counting is $N_0$ ($N_0$ is a positive integer). Also, the address region determining unit 1460 sets "0" as the initial value of a number of times i of the occurrence frequency counting processing.

$N=N_0$ $i=0$

Next, in step S1606, the address region determining unit 1460 determines whether or not the number of times i of processing is greater than a number of times N of frequency counting. In the event of the address region determining unit 1460 having determined that the number of times i of processing is greater than the number of times N of frequency counting, the processing proceeds to step S1612. In the event of the address region determining unit 1460 having determined that the number of times i of processing is equal to or smaller than the number of times N of frequency counting (not greater than the number of times N of frequency counting), the processing proceeds to step S1608.

Next, in step S1608, the address region determining unit 1460 receives the address Adrs(Tx(t)) from the address generating unit 402. The address Adrs(Tx(t)) has the address value generated based on the power value p(t) of the transmission signal Tx(t) at the current reference point-in-time t. The address region determining unit 1460 counts for every address value the frequency of occurrence thereof based on the received address Adrs(Tx(t)).

Next, in step S1610, the address region determining unit 1460 increments the value of the number of times i of processing by "1", thereby updating the number of times i of processing. After updating of the number of times i of processing, the processing returns to step S1606.

Next, in step S1612, the address region determining unit 1460 calculates an address value occurrence frequency distribution as to the address Adrs(Tx(t)) based on the occurrence frequency counted in steps S1606 through S1610. The address region determining unit 1460 divides the address region to be corrected at each LUT into three address regions based on the calculated address value occurrence frequency distribution. The address region determining unit 1460 performs processing for dividing the address region to be corrected into three regions so that the totals of the occurrence frequencies of address values in the divided multiple address regions are mutually equal, thereby dividing the address region to be corrected into three address regions 1501 through 1503 as illustrated in FIG. 16.

The address region determining unit 1460 obtains the value of an address serving as a boundary of the multiple divided address regions, and sets the obtained address value as a boundary address value adrsTHn (n is an integer equal to or greater than 1). The address region determining unit 1460 obtains an address value $A_{th12}$ serving as a boundary between the address region 1501 and the address region 1502 illustrated in FIG. 16, and sets the obtained address value as a boundary address value adrsTh1, and also obtains an address value $A_{th23}$ serving as a boundary between the address region 1502 and the address region 1503, and sets the obtained address value as a boundary address value adrsTh2.

adrsTh1=$A_{th12}$ adrsTh2=$A_{th23}$

According to the above steps S1604 through S1612, address region determination processing 1640 as to the address region to be corrected is performed at the offset correction processing unit 1470.

Next, in step S1614, the offset control unit 1432 sets parameters used for offset correction value setting processing, offset compensation value updating processing, and offset correction processing in later-described steps S1618 through S1622. The details of the parameters to be set are as described with the flowchart in FIG. 13. However, the boundary address values set in step S1612 are set as the boundary address values adrsTh1 and adrsTh2, respectively.

Next, in step S1616, the offset control unit 1432 selects one LUT to be processed out of the LUTa 406 through LUTd 412. The offset control unit 1432 cyclically selects the corresponding LUT in the sequence of LUTa 406, LUTb 408, LUTc 410, LUTd 412, LUTa 406, LUTb 408, and so on, for example.

Next, in step S1618, the offset control unit 1432 executes distortion compensation coefficient correction processing 1650 as to the address region 1501 of the selected LUT_x to be processed (x is any of a through d). This distortion compensation coefficient correction processing 1650 is the same as the distortion compensation coefficient correction processing 1350 described in steps S1308 through S1314 in the flowchart in FIG. 13.

Next, in step S1620, the offset control unit 1432 executes distortion compensation coefficient correction processing 1660 as to the address region 1502 of the selected LUT_x to be processed. This distortion compensation coefficient correction processing 1660 is the same as the distortion compensation coefficient correction processing 1360 described in steps S1316 through S1322 in the flowchart in FIG. 13.

Next, in step S1622, the offset control unit 1432 executes distortion compensation coefficient correction processing 1670 as to the address region 1503 of the selected LUT_x to be processed. This distortion compensation coefficient correction processing 1670 is the same as the distortion compensation coefficient correction processing 1370 described in steps S1324 through S1330 in the flowchart in FIG. 13.

A series of processing performed in the above steps S1604 through S1622 is the distortion compensation coefficient correction processing that the distortion compensation apparatus 1402 executes.

Next, in step S1632, the compensation coefficient updating unit 324 performs distortion compensation coefficient updating processing as to the respective LUT. The details of this distortion compensation coefficient updating processing are as described with the flowchart in FIG. 6. After the distortion compensation coefficient updating processing, the processing returns to step S1616.

In step S1616, the offset control unit 1432 selects another LUT out of the LUTa 406 through LUTd 412 as the next LUT to be processed. The offset control unit 1432 executes the distortion compensation coefficient correction processes 1650 through 1670 as to the address regions 1501 through 1503 regarding the selected LUT to be processed.

As described above, with the distortion compensation coefficient correction and updating processing illustrated in FIG. 16, in the same way as with the distortion compensation coefficient correction and updating processing illustrated in FIGS. 6 and 13, according to the offset amount calculation processing and offset correction processing, a distortion compensation coefficient is clipped to the upper limit or lower limit of the coefficient setting range, whereby the distortion compensation performance can be suppressed from deterioration. Further, according to the offset compensation value updating processing, even in the event that the value of the distortion compensation coefficient stored in each LUT is corrected by the offset correction processing, suitable distortion compensation processing can be performed using a distortion compensation coefficient generated in a pseudo manner.

Further, with the distortion compensation coefficient correction and updating processing illustrated in FIG. 16, in the same way as with the distortion compensation coefficient correction and updating processing illustrated in FIGS. 6 and 13, according to the offset correction value setting processing, a suitable value according to the calculated offset amount can be set as the offset correction value of a distortion compensation coefficient, and also the value of the offset correction unit is suitably adjusted, whereby the influence of the offset correction processing to be applied to the convergence of a distortion compensation coefficient in the distortion compensation coefficient updating processing can be suppressed small.

Further, with the distortion compensation coefficient correction and updating processing illustrated in FIG. 16, in the same way as with the distortion compensation coefficient correction and updating processing illustrated in FIG. 13, the offset amounts LUTofst_x1 through LUTofst_x3 corresponding to the address regions 1501 through 1503 of the address region to be corrected can individually be calculated, whereby the distortion compensation coefficient offset correction processing within each LUT can more accurately be controlled even in the event that the frequency of occurrence of the transmission signal Tx(t) has bias regarding the power value p(t).

In addition, with the distortion compensation coefficient correction and updating processing illustrated in FIG. 16, according to the address region determination processing 1640, an address value occurrence frequency distribution is calculated by counting the frequency of occurrence for every address value based on the address Adrs(Tx(t)), and the range of each address region within the address region to be corrected is determined based on the calculated address value occurrence frequency distribution. Thus, the address region dividing mode of the address region to be corrected can be changed according to difference in a communication environment where the distortion compensation coefficient correction and updating processing is performed, and the range of each address region can be optimized. Thus, the distortion compensation coefficient offset correction and updating processing within each LUT can more accurately be controlled as compared to the case of the distortion compensation coefficient offset correction and updating processing illustrated in FIG. 13.

Accordingly, with the distortion compensation coefficient offset correction processing and updating processing illustrated in FIG. 16, the precision of the distortion compensation coefficient offset correction and updating processing within each LUT can be improved as compared to the distortion compensation coefficient offset correction and updating processing illustrated in FIG. 13.

Note that, with the above embodiment, though counting of the frequency of occurrence for every address value has been carried out by a certain number of times of counting worth, thereby calculating an address value occurrence frequency distribution, the present disclosure is not restricted to this, and an address value occurrence frequency distribution may be calculated by carrying out counting of the frequency of occurrence for every address value for a certain period of time for example.

Though description has been made so far regarding a wireless communication device, a distortion compensation apparatus, and a distortion compensation method, according to an exemplary embodiment of the present disclosure, the present disclosure is not restricted to the specifically disclose embodiments, and various modifications and changes can be made without departing from the scope of the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus for performing distortion compensation processing by applying inverse properties of distortion properties of a power amplifier to a transmission signal to be input to the power amplifier, comprising:

a plurality of distortion compensation coefficient storages configured to store a plurality of first distortion compensation coefficients used for said distortion compensation processing; and circuitry configured to subject each of said first distortion compensation coefficients stored in each of said plurality of distortion compensation coefficient storages to offset correction processing that corrects each offset for the each of the distortion compensation coefficients, generate one or more second distortion compensation coefficients corresponding to said offset correction processing not having been performed from the first distortion compensation coefficients that have been subjected to the offset correction processing based on generated delay at a particular reference time, the first compensation coefficients being stored in the distortion compensation coefficient storages corresponding to the transmission signal at different times, and subject said transmission signal to said distortion compensation processing based on said one or more second distortion compensation coefficients.

2. The distortion compensation apparatus according to claim 1, wherein said circuitry is further configured to:

calculate an offset amount of each of said first distortion compensation coefficients as to each of said plurality of distortion compensation coefficient storages to perform said offset correction processing based on said calculated offset amount, calculate an offset compensation value as to each of the first distortion compensation coefficients after said offset correction processing based on said calculated offset amount; and generate said one or more second distortion compensation coefficients corresponding to said offset correction processing not having been performed and said offset compensation value to supply said one or more second distortion compensation coefficients for said distortion compensation processing.

3. The distortion compensation apparatus according to claim 1, wherein said circuitry calculates an offset amount of each of said first distortion compensation coefficients as to each of said plurality of distortion compensation coefficient storages, and when said calculated offset amount is a value out of a predetermined range, subjects the corresponding first distortion compensation coefficient stored in the corresponding distortion compensation coefficient storage to said offset correction processing.

4. The distortion compensation apparatus according to claim 1, wherein the circuitry is further configured to search a maximum power value of said transmission signal; and wherein said circuitry changes an address region to be corrected within the corresponding distortion compensation coefficient storage where said offset correction processing is performed, based on the maximum power value of said transmission signal determined by said search.

5. The distortion compensation apparatus according to claim 1, wherein each of said plurality of distortion compensation coefficient storages includes a plurality of address regions to be corrected where said offset correction processing is performed;

and wherein said offset correction processing is performed independently for every said plurality of address regions to be corrected.

6. The distortion compensation apparatus according to claim 5, wherein the circuitry is further configured to:

generate an address of the corresponding distortion compensation storage based on a power value of said transmission signal; and count a frequency of occurrence for each address value of said generated address to determine said plurality of address regions to be corrected within the corresponding distortion compensation storage based on said counted frequency of occurrence.

7. A distortion compensation method for performing distortion compensation processing for compensating distortion of a power amplifier as to a transmission signal, comprising:
performing offset correction processing as to a plurality of first distortion compensation coefficients stored in each of a plurality of distortion compensation coefficient storages;
reading out said first distortion compensation coefficients according to a power value of said transmission signal from said plurality of distortion compensation coefficient storages;
generating one or more second distortion compensation coefficients corresponding to said offset correction processing not having been performed from the first distortion compensation coefficients that have been subjected to the offset correction processing based on generated delay at a particular reference time, the first compensation coefficients being stored in the distortion compensation coefficient storages corresponding to the transmission signal at different times; and
performing said distortion compensation processing as to said transmission signal based on said one or more second distortion compensation coefficients.

8. The distortion compensation method according to claim 7, further comprising:
calculating an offset amount of each of said first distortion compensation coefficients as to each of said plurality of distortion compensation coefficient storages; and
calculating an offset compensation value as to each of the first distortion compensation coefficients after said offset correction processing based on said calculated offset amount;
wherein, with the performing of said offset correction processing, said offset correction processing is performed based on said calculated offset amount;
and wherein the generating of said one or more second distortion compensation coefficients is based on said offset compensation value.

9. The distortion compensation method according to claim 7, further comprising:
calculating an offset amount of each of said first distortion compensation coefficients as to each of said plurality of distortion compensation coefficient storages; and
performing said offset correction processing as to the corresponding first distortion compensation coefficient stored in said corresponding distortion compensation coefficient storage when said calculated offset amount is a value out of a predetermined range.

10. The distortion compensation method according to claim 7, further comprising:
searching a maximum power value of said transmission signal; and
changing an address region to be corrected within said corresponding distortion compensation coefficient storage where said offset correction processing is performed, based on the maximum power value of said transmission signal determined by said searching.

11. The distortion compensation method according to claim 7, wherein a plurality of address regions to be corrected where said offset correction processing is performed are set to each of said plurality of distortion compensation coefficient storages;
and wherein, with the performing of said offset correction processing, said offset correction processing is performed independently for every said plurality of address regions to be corrected.

12. The distortion compensation method according to claim 11, further comprising:
generating an address of said corresponding distortion compensation coefficient storage based on a power value of said transmission signal; and
counting a frequency of occurrence for every address value of said generated address to determine said plurality of address regions to be corrected within said corresponding distortion compensation storage based on said counted frequency of occurrence.

13. A wireless communication device comprising:
a distortion compensation apparatus configured to perform distortion compensation processing by applying opposite properties of distortion properties of a power amplifier as to a transmission signal to be input to the power amplifier beforehand;
an up converter configured to perform orthogonal modulation processing and also frequency conversion processing to a radio frequency as to the output signal of said distortion compensation apparatus; and
the power amplifier configured to perform power amplification processing as to the output signal of said up converter;
wherein said distortion compensation apparatus includes
a plurality of distortion compensation coefficient storages configured to store a plurality of first distortion compensation coefficients used for said distortion compensation processing, and
circuitry configured to
perform offset correction processing as to each of said first distortion compensation coefficients stored in each of said plurality of distortion compensation coefficient storages,
generate one or more second distortion compensation coefficients corresponding to said offset correction processing not having been performed from the first distortion compensation coefficients that have been subjected to the offset correction processing based on generated delay at a particular reference time, the first compensation coefficients being stored in the distortion compensation coefficient storages corresponding to the transmission signal at different times, and
perform said distortion compensation processing as to said transmission signal based on said one or more second distortion compensation coefficients.

* * * * *